US012696696B2

(12) United States Patent
Lin et al.

(10) Patent No.: US 12,696,696 B2
(45) Date of Patent: Jul. 28, 2026

(54) DIELECTRIC DENSIFICATION

(71) Applicant: Taiwan Semiconductor Manufacturing Company, Ltd., Hsinchu (TW)

(72) Inventors: Cheng-Ming Lin, Kaohsiung City (TW); Szu-Hua Chen, Tainan City (TW); Kenichi Sano, Hsinchu (TW); Wei-Yen Woon, Taoyuan City (TW); Szuya Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 255 days.

(21) Appl. No.: 18/347,683

(22) Filed: Jul. 6, 2023

(65) Prior Publication Data

US 2024/0266166 A1 Aug. 8, 2024

Related U.S. Application Data

(60) Provisional application No. 63/483,848, filed on Feb. 8, 2023.

(51) Int. Cl.
| | |
|---|---|
| *H10P 14/60* | (2026.01) |
| *C23C 16/40* | (2006.01) |
| *C23C 16/56* | (2006.01) |
| *H01J 37/32* | (2006.01) |
| *H10P 14/692* | (2026.01) |
| *H10P 95/00* | (2026.01) |

(52) U.S. Cl.
CPC ........ *H10P 14/6529* (2026.01); *C23C 16/401* (2013.01); *C23C 16/56* (2013.01); *H01J 37/3244* (2013.01); *H10P 14/69215* (2026.01); *H10P 14/6922* (2026.01); *H10P 95/062* (2026.01)

(58) Field of Classification Search
CPC ......... H01L 21/02337; H01L 21/02126; H01L 21/02164; H01L 21/31053; H01L 21/3105; C23C 16/401; C23C 16/56; H01J 37/3244
USPC ........................................... 438/692
See application file for complete search history.

(56) References Cited

U.S. PATENT DOCUMENTS

| | | | | |
|---|---|---|---|---|
| 2004/0175958 A1* | 9/2004 | Lin | ................... | H01L 21/02137 |
| | | | | 257/E21.259 |
| 2020/0098625 A1* | 3/2020 | Yin | ................... | H01L 21/76895 |
| 2021/0366907 A1 | 11/2021 | Liao | | |
| 2022/0037528 A1 | 2/2022 | Chuang | | |
| 2022/0216340 A1 | 7/2022 | Lin | | |

FOREIGN PATENT DOCUMENTS

| | | | | | |
|---|---|---|---|---|---|
| CN | 113206090 A | * | 8/2021 | ............. | H10D 84/85 |
| CN | 115172449 A | * | 10/2022 | ........... | H01L 21/324 |
| TW | I299543 B | | 8/2008 | | |

* cited by examiner

*Primary Examiner* — Duy Vu N Deo

(74) *Attorney, Agent, or Firm* — HAYNES AND BOONE, LLP

(57) ABSTRACT

A low thermal budget dielectric material treatment is provided. An example method of the present disclosure includes providing a semiconductor structure, depositing a dielectric material over the semiconductor structure, treating the dielectric material with a gaseous species carried in a supercritical fluid, and after the treating, reducing a thickness of the dielectric material.

20 Claims, 24 Drawing Sheets

100

RECEIVE A WORKPIECE 102

DEPOSIT A DIELECTRIC LAYER OVER THE WORKPIECE 104

TREAT THE DIELECTRIC LAYER WITH HYDROGEN RADICAL, OXYGEN RADICAL, OR HYDROXYL RADICAL CARRIED BY A SUPERCRITICAL FLUID 106

PLANARIZE THE TREATED DIELECTRIC LAYER 108

ETCH BACK THE TREATED DIELECTRIC LAYER 110

300

330
330
338
332
308B
302

3080T
326M
3080B
312
306B

DIELECTRIC DENSIFICATION

PRIORITY DATA

The present application claims the benefit of U.S. Provisional Application No. 63/483,848, filed Feb. 8, 2023, the entirety of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, semiconductor fabrication inevitably involves depositing a dielectric material and then etching back or planarizing the deposited dielectric material. In some existing technology, the as-deposited dielectric material may not possess the required density or uniformity to provide a predictable rate of etching or planarization. As a remedial measure, the as-deposited dielectric material may undergo anneal processes. While these annealing processes are shown to effectively improve the quality of the dielectric material and have been adopted widely, they may increase the thermal budget and even impact electrical performance of structures that have been fabricated before the annealing processes. Therefore, there is a need for methods to improve quality of a dielectric layer without substantially increasing the thermal budget or impacting the performance of existing structures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
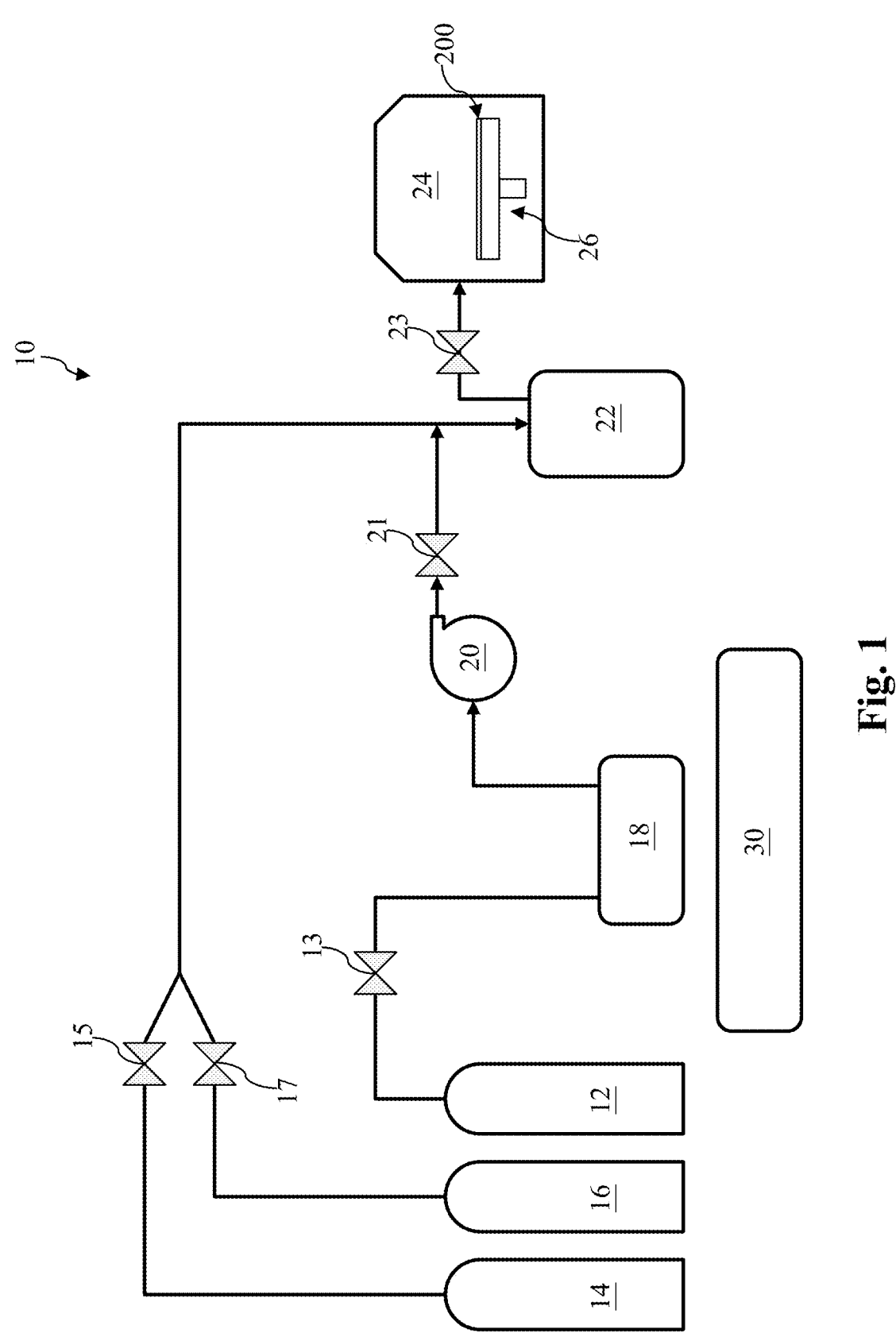
FIG. 1 illustrates a schematic diagram of a treatment system, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Dielectric materials are used in various isolation features in semiconductor devices. After deposition of a dielectric material, an anneal process, such as a steam annealing, rapid thermal annealing (RTA), or spike annealing, may be performed to improve the quality and density of the dielectric material. Without such annealing processes, the as-deposited dielectric material may be too porous or too defective to provide a uniform etch rate or planarization rate. For example, the dielectric material may etch or planarize fast to cause dishing or indentation. Sometimes the anneal process may include a temperature greater than 500° C. or may require presence of steam. What is challenging is that both the high temperature annealing and the presence of steam can be detrimental to performance or integrity of metal gate structures and metal lines. In some instances, the annealing may cause threshold voltage shifting or On-state current degradation. This is especially true to stacked multi-gate devices where a top multi-gate device is disposed over a bottom multi-gate device. When the top multi-gate device and the bottom multi-gate device are of different conductivity types, the stacked multi-gate device may be a complementary field effect transistor (C-FET). Formation of dielectric isolation features in a stacked multi-gate device may come after formation of metal gates or metal interconnects and may bring undesirable results. A low-thermal-budget dielectric material densification treatment is desired.

The present disclosure provides a low-thermal-budget treatment method to densify dielectric materials deposited on a semiconductor structure. In an example process, hydrogen or oxygen is turned into hydrogen radical or oxygen radical when mixing with a supercritical fluid in an autoclave. An example supercritical fluid for this process may be supercritical carbon dioxide that has a supercritical point with a supercritical temperature above about 31° C. and a supercritical pressure greater than about 72.8 atmosphere (atm). The low supercritical point of supercritical carbon dioxide makes it a great candidate for low-temperature processing. The hydrogen or oxygen radical is carried by the supercritical fluid to a process chamber to treat a dielectric material. Because the supercritical fluid has a low surface tension and is highly permeable, it can enable mass transfer of the hydrogen or oxygen radical through high-aspect ratio structures. The low process temperature is harmless to existing structures, including metal gate structures or metal lines.

A schematic diagram of a treatment system 10 according to one or more aspects of the present disclosure is illustrated in FIG. 1. The treatment system 10 includes a first treatment gas source 14, a second treatment gas source 16, a carrier fluid source 12, a heat exchanger 18, a pump 20, an autoclave 22, and a process chamber 24. Depending on the composition of the dielectric material to be treated, the first treatment gas source 14 and the second treatment gas source 16 may supply different kinds of treatment gases. In embodiments where the dielectric material to be treatment includes silicon (Si) and oxygen (O), such as silicon oxide, the first treatment gas source 14 is an oxygen ($O_2$) source and the second treatment gas source 16 is a hydrogen ($H_2$) source. The carrier fluid source 12 is a source of a fluid species that will be turned into a supercritical fluid. According to the present disclosure, the fluid species supplied by the carrier fluid source 12 is one that has a critical temperature below 300° C. to implement low thermal budget treatment. In the depicted embodiments, the carrier fluid source 12 is carbon dioxide ($CO_2$) source.

Referring still to FIG. 1, being controlled by a first valve 13, the carrier fluid source 12 is fluid communication with the heat exchanger 18. The heat exchanger 18 is configured to cool down or heat up the carrier fluid to a temperature above the supercritical temperature of the carrier fluid. When the carrier fluid is carbon dioxide, the supercritical temperature is about 31° C. Depending on the process requirement, the heat exchanger 18 may heat up or cool down the carbon dioxide from the carrier fluid source 12 to a temperature between about 100° C. and about 200° C. The carrier fluid that is heated up or cooled down by the heat exchanger 18 is pumped by the pump 20 before it goes to the autoclave 22. The flow of the carrier fluid between the pump 20 and the autoclave 22 is controlled by a fourth valve 21. The first treatment gas source 14 and the second treatment gas source 16 are each in fluid communication with the autoclave 22. The flow between the first treatment gas source 14 and the autoclave 22 is controlled by a second valve 15. The flow between the second treatment gas source 16 and the autoclave 22 is controlled by a third valve 17. The first valve 13, the second valve 15, the third valve 17, and the fourth valve 21 may be gate valves, globe valves, check valves, plug valves, ball valves, butterfly valves, or slam-shut valves that are controlled by a solenoid or a motorized mechanism such that they can be selectively closed or opened based on signals of a control unit 30. With the carbon dioxide at a temperature above its supercritical temperature, the autoclave 22 pressurizes the carrier fluid to a pressure above the supercritical pressure. At this point, the carrier fluid reaches the supercritical point and turns into a supercritical fluid. In embodiments where the carrier fluid is carbon dioxide, the autoclave 22 pressurizes the carrier fluid to a pressure above its supercritical pressure, which is about 72.8 atmosphere (atm) and the carbon dioxide turns into supercritical carbon dioxide ($scCO_2$). In some embodiments, the pressure at the autoclave 22 may be kept at between about 100 atm and about 200 atm.

Due to the high pressure (at least 72.8 times of the atmospheric pressure) and the presence of the supercritical carbon dioxide, the oxygen or hydrogen from the first treatment gas source 14 or the second treatment gas source 16 may generate hydrogen radical, oxygen radical, hydroxyl radical, or a combination thereof. For example, when the second valve 15 is open and the third valve 17 is closed, oxygen from the first treatment gas source 14 may be energized to form oxygen radicals. When the second valve 15 is closed and the third valve 17 is open, hydrogen from the second treatment gas source 16 may be energized to form hydrogen radicals. When both the second valve 15 and the third valve 17 are open, hydrogen and oxygen from both treatment gas sources may be energized to form hydrogen radicals, oxygen radicals, or hydroxyl radicals. Because hydrogen and/or oxygen may dissolve in the supercritical carbon dioxide in the autoclave 22, it can be said that the fluid in the autoclave 22 is a solution of oxygen and/or hydrogen in supercritical carbon dioxide.

The autoclave 22 is in fluid communication with a process chamber 24. The flow between the autoclave 22 and the process chamber 24 is controlled by a fifth valve 23. The fifth valve 23 may be similar to the first valve 13, the second valve 15, the third valve 17, or the fourth valve 21 and is operational based on signals from the control unit 30. Besides the valves, the control unit 30 also monitors and controls the temperature at the heat exchanger 18 and the pressure at the autoclave 22. The process chamber 24 may be a chemical vapor deposition (CVD) chamber, a flowable CVD (FCVD) chamber, a physical vapor deposition (PVD) chamber, an atomic layer deposition (ALD) chamber, or a dedicated radical gas treatment chamber. The process chamber 24 includes a substrate stage 26, which is configured to receive and hold a substrate 200 (or a workpiece 200). While not explicitly shown in the figures, the substrate stage 26 includes a heating mechanism to heat up the substrate 200 to a pre-determined process temperature. In some embodiments, the heating mechanism may heat up the substrate 200 to a temperature between about 100° C. and about 200° C. during the treatment process. The heating mechanism is also controlled by the control unit 30. For simplicity and clear illustration, FIG. 1 omits all lines between the control unit 30 and apparatus it controls. The omission of lines does not in any way suggests a lack of electrical or wireless connection between the control unit 30 and the apparatus it controls. The substrate 200 (or workpiece 200) includes a dielectric layer deposited thereon.

Supercritical fluids have several special properties that make them ideal for the treatment process of the present disclosure. For example, supercritical fluids have no surface tension because they are not subject to the vapor-liquid boundary so no molecules have the attraction to the interior of the liquid phase. Supercritical fluids also have a low viscosity similar to that of its gas phase. The lack of surface tension and low viscosity give supercritical fluids superior permeability to enter into a material's matrix or structures of high aspect ratios. The same applies to supercritical carbon dioxide. Supercritical carbon dioxide has no surface tension and has high permeability. In the depicted embodiments, the supercritical carbon dioxide carries the oxygen radicals, hydrogen radicals, and/or hydroxyl radicals and bring them to contact with surfaces of the dielectric layer deposited on the substrate 200 in the process chamber 24.

Figure 2:
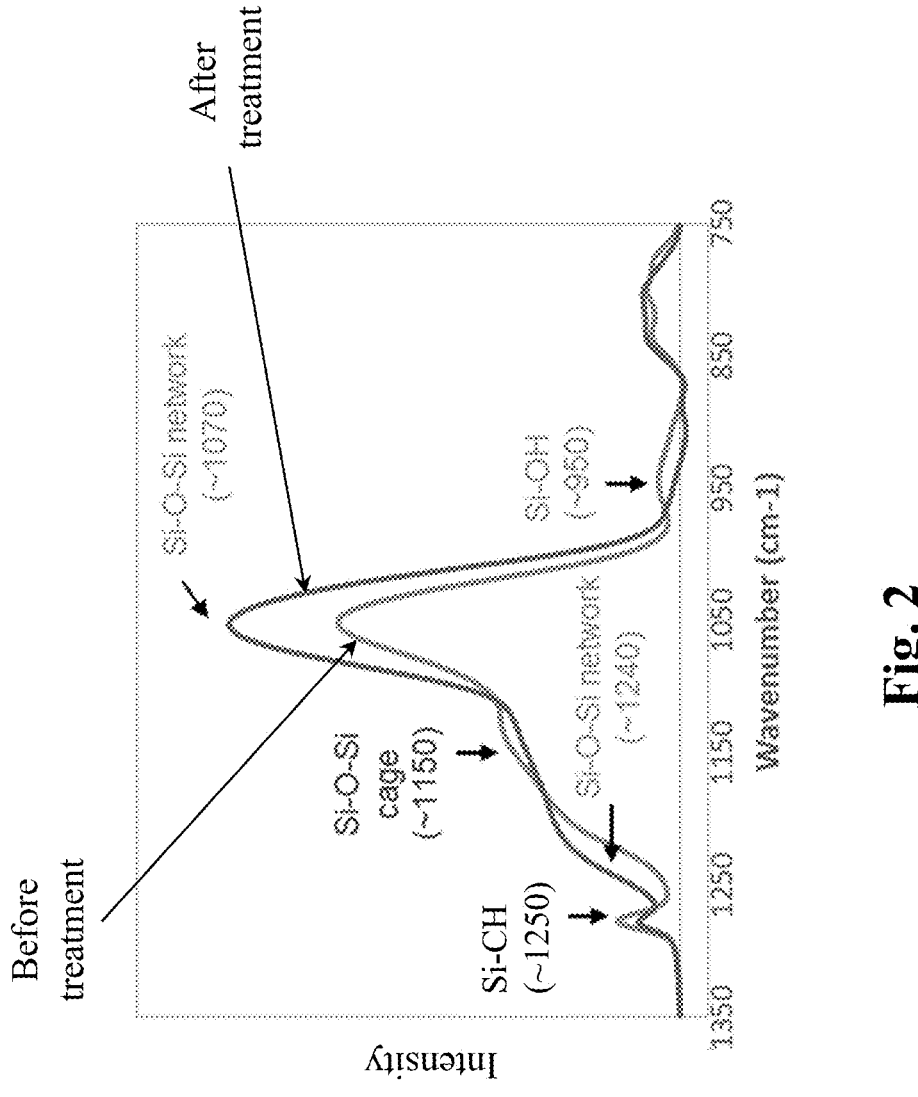
FIG. 2 illustrates a representative Fourier transform infrared spectroscopy graph showing effects of the treatment system in FIG. 1, according to one or more aspects of the present disclosure.

FIG. 2 illustrates effects of using the treatment system 10 in FIG. 1 on the dielectric layer deposited on the substrate 200 in the process chamber 24. Based on experiment results, when the dielectric layer includes silicon (Si) and oxygen (O) or silicon oxide, the treatment system 10 in FIG. 1 modifies Si—OH bonds and Si—CH bonds and causes the dielectric layer to have a better Si—O—Si cage or network.

FIG. 2 includes a Fourier transform infrared (FTIR) spectroscopy graph that shows intensities of signature absorptions peaks of various characteristic bonds or clusters. Specifically, FIG. 2 illustrates a Si—CH absorption peak at around $1250 \text{ cm}^{-1}$, a first network form Si—O—Si absorption peak at around $1240 \text{ cm}^{-1}$, a cage form Si—O—Si absorption peak at around $1150 \text{ cm}^{-1}$, a second network form Si—O—Si absorption peak at around $1070 \text{ cm}^{-1}$, and a Si—OH absorption peak at around $950 \text{ cm}^{-1}$. As shown in FIG. 2, the absorption intensities for the Si—OH and Si—CH bonds decrease while the absorption intensities for cage form Si—O—Si or network form Si—O—Si increase. The formation of Si—O—Si bonds is signature of improved, more dense structure of the dielectric layer. FIG. 2 demonstrates that supercritical carbon dioxide enables oxygen radicals, hydrogen radicals, and/or hydroxyl radicals to effectively treat the dielectric layer even at a rather low treatment temperature—between around 100° C. and about 200° C. Compared to existing annealing processes that include a high temperature above 500° C. or even in the presence of steam, the treatment system 10 in FIG. 1 involves a much lower thermal budget and a much smaller risk of damaging existing structures on the substrate 200.

Figure 3:
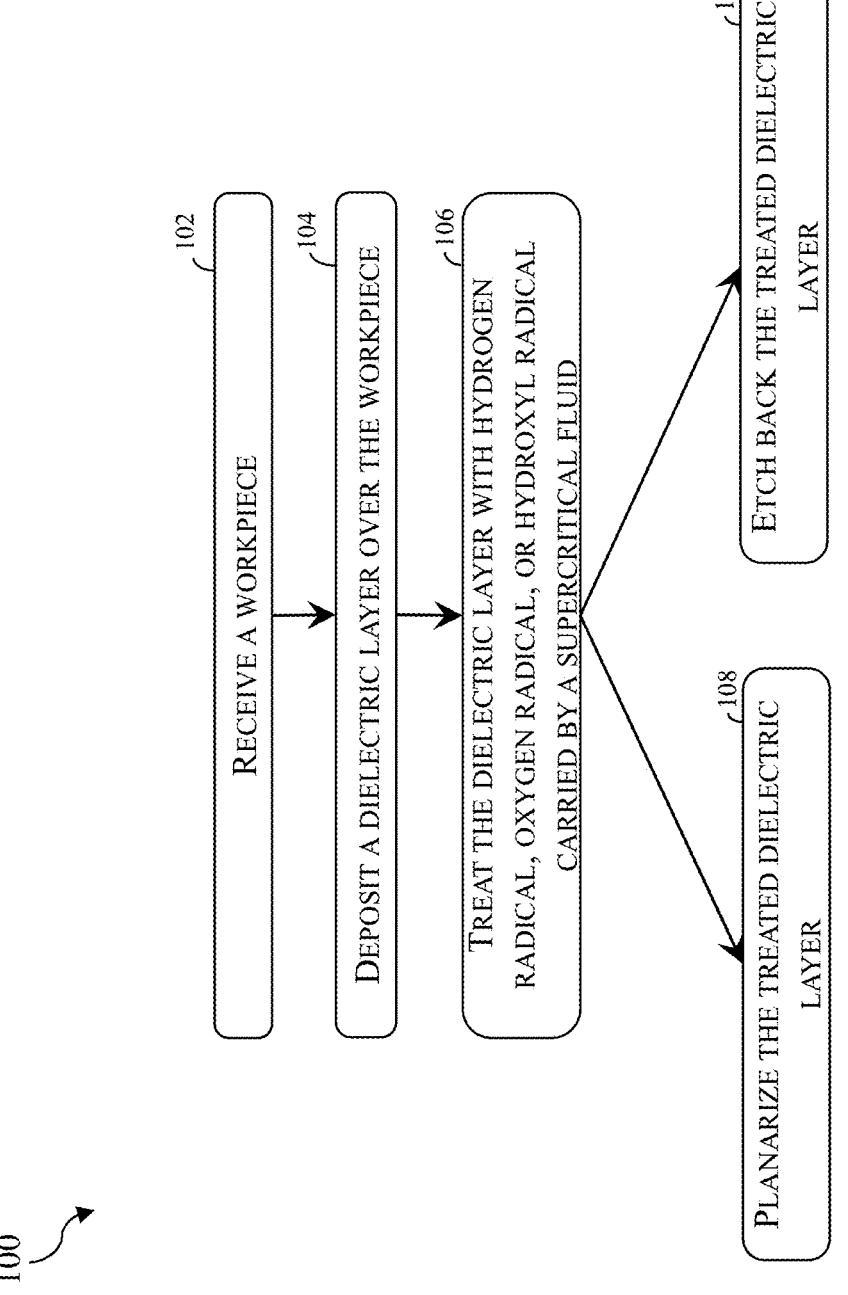
FIG. 3 illustrates a flow diagram of a method to improve quality of a dielectric material, according to one or more aspects of the present disclosure.

FIG. 3 is a flowchart illustrating method 100 for treating a dielectric layer that is to be subjected to planarization or etching backing. Method 100 is merely an example and is not intended to limit the present disclosure to what is explicitly illustrated in method 100. Additional steps may be provided before, during and after method 100, and some steps described can be replaced, eliminated, or moved around for additional embodiments of the method. Not all steps are described herein in detail for reasons of simplicity. Method 100 may be applied in processes depicted in FIGS. 4-24, which are fragmentary cross-sectional views or top views of a workpiece 200, a workpiece 300, or a workpiece 400 at different stages of fabrication. It is noted that while the workpiece 200, workpiece 300 and workpiece 400 have different reference numerals, they may be the same workpiece or different regions of the same workpiece. The separate reference numerals only serve the purpose to differentiate different applications of the treatment system 10 in FIG. 1 or the method 100 in FIG. 3 at different stages of fabrication. Additionally, throughout the present application, like reference numerals denote like features, unless otherwise excepted.

Method 100 includes a block 102, a block 104, a block 106, a block 108, and a block 110. At block 102, a workpiece 200 is received. The workpiece 200 may include a substrate and various features that have been fabricated on the substrate. The substrate may include an elementary (single element) semiconductor, such as silicon (Si), germanium (Ge), and/or other suitable materials; a compound semiconductor (i.e., alloy semiconductor), such as silicon carbide (SiC), gallium arsenic (GaAs), gallium phosphide (GaP), indium phosphide (InP), indium arsenide (InAs), indium antimonide (InSb), silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), gallium indium arsenic phosphide (GaInAsP), and/or other suitable materials. The substrate may be a single-layer material having a uniform composition. Alternatively, the substrate may include multiple material layers having similar or different compositions suitable for IC device manufacturing. In one example, the substrate may be a silicon-on-insulator (SOI) substrate having a silicon layer formed on a buried silicon oxide (BOX) layer. In some embodiments, the substrate includes various doped regions, such as n-type wells or p-type wells. The doped regions may be doped with n-type dopants, such as phosphorus (P) or arsenic (As), and/or p-type dopants, such as boron (B) or $BF_2$, depending on design requirements. Doped regions may be formed by implantation of dopant atoms, in-situ doped epitaxial growth, and/or other suitable techniques. The features that have already been formed on the substrate may include, for example, active regions, dielectric isolation features, metal gate structures, dielectric gate spacers, contact structures, and epitaxial source/drain features. As illustrated in FIG. 1, the workpiece 200 (or substrate 202 for simplicity) is received at block 102 when it is placed on the substrate stage 26 in the process chamber 24.

At block 104, a dielectric layer is deposited over the workpiece. The dielectric layer may include silicon (Si) and oxygen (O). The dielectric layer may also include other elements, such as carbon (C), hydrogen (H), or nitrogen (N). In some embodiments, the dielectric layer may include silicon oxide, silicon oxycarbide, silicon oxynitride, or silicon oxycarbonitride. In one embodiment, the dielectric layer include silicon oxide. The dielectric layer may be deposited on the workpiece using spin-on coating, FCVD, CVD, PVD, or ALD. The workpiece referred to herein may include the workpiece 200 shown in FIG. 4-12, workpiece 300 shown in FIGS. 13-17, or workpiece 400 shown in FIG. 18-24.

At block 106, the dielectric layer on the workpiece is treated with hydrogen radical, oxygen radical, or hydroxyl radical that is carried by a supercritical fluid. In other words, at block 106, the dielectric layer on the workpiece is placed in the process chamber 24 in FIG. 1 to receive treatment. Oxygen from an oxygen source and/or hydrogen from a hydrogen source is directed to an autoclave where a supercritical fluid is generated. Oxygen and/or hydrogen dissolved in the supercritical fluid is energized to generate oxygen radical, hydrogen radical, or hydroxyl radical. The oxygen radical, hydrogen radical, or hydroxyl radical is carried by the supercritical fluid to a process chamber to come in contact with the dielectric layer on the workpiece. In one embodiment, the carrier fluid is carbon dioxide and the supercritical fluid is supercritical carbon dioxide. Using references in FIG. 1, oxygen from the first treatment gas source 14 and/or hydrogen from the second treatment gas source 16 are directed to the autoclave 22 where carbon dioxide from the carrier fluid source 12 is turned into supercritical carbon dioxide. The oxygen and/or hydrogen are energized to form oxygen radical, hydrogen radical, or hydroxyl radical in the autoclave 22 and are carried to the process chamber 24 to treat the dielectric layer on the workpiece 200.

As described above in conjunction with FIG. 2, the treatment modifies the dielectric layer by improve the cage form or network form Si—O—Si bonding, thereby densifying the dielectric layer. One of the reasons why the dielectric layer is treated using the treatment system 10 in FIG. 1 is to improve the planarization or etching uniformity of the dielectric layer. As shown in FIG. 3, the treated dielectric layer is planarized at block 108 or etching back at block 110. At block 108, the workpiece, along with the dielectric layer, is planarized using a chemical mechanical polishing (CMP). At block 110, the workpiece, along with the dielectric layer, is etched back using a dry etch process, a wet etch process, or a combination thereof. In some embodiments, the etching back includes anisotropic etch process that reduces thickness of the dielectric layer on top-facing surfaces of the workpiece.

Figure 4:
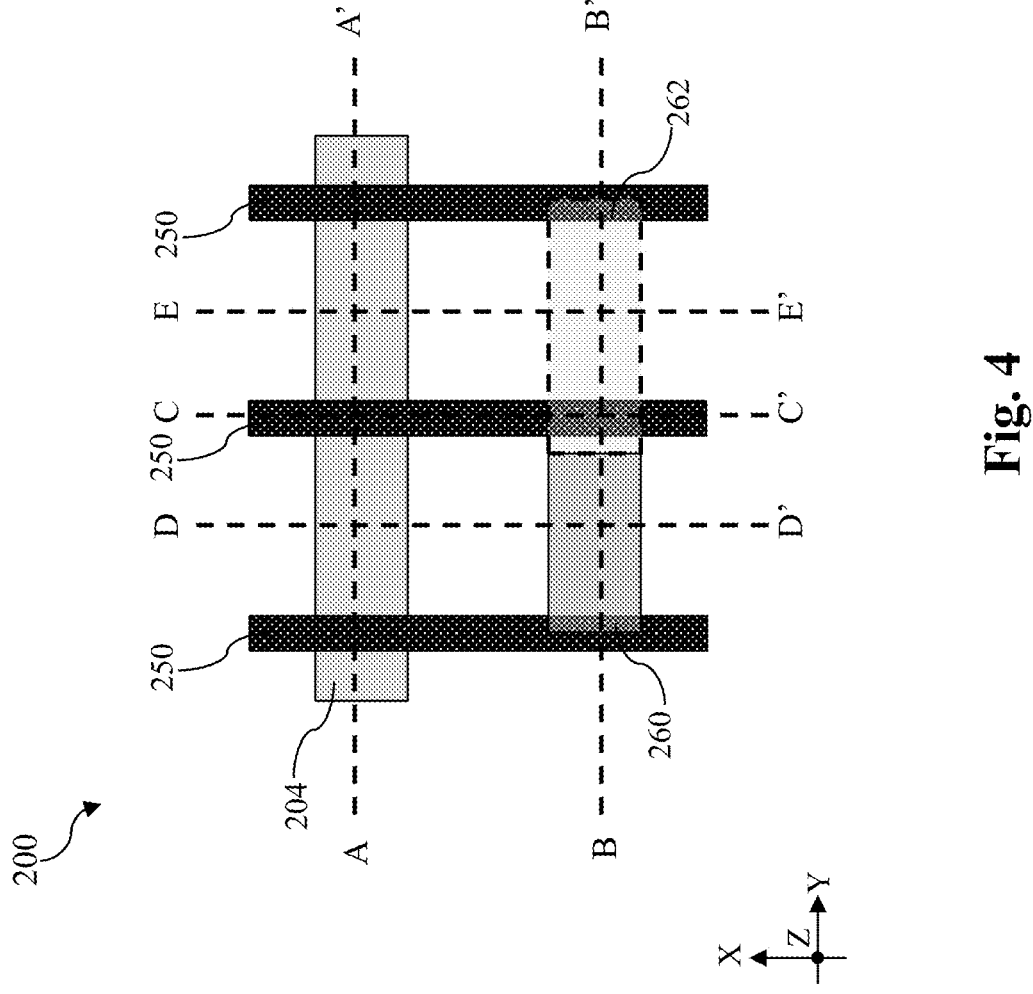
FIG. 4 illustrates a fragmentary top view of a workpiece 200, according to one or more aspects of the present disclosure.

FIGS. 4-12 illustrate application of the treatment system 10 in FIG. 1 or method 100 in FIG. 3 to an isolation feature adjacent a vertical contact feature or to an interlayer dielectric layer during fabrication of a C-FET. FIG. 4 illustrates a simplified fragmentary top view of a workpiece 200. The workpiece 200 includes an active region 204 extending lengthwise along the Y direction and gate structures 250 extending lengthwise along the X direction. Besides the active region 204 and the gate structures 250, the workpiece 200 includes a vertical contact feature 260 and an opening 262 adjacent the vertical contact feature 260. As will be described further below, the active region 204 includes a vertical stack of nanostructures (or channel members) stacked along the Z direction. Each of the gate structures 250 includes a bottom segment and a top segment over the bottom segment. The top segment and the bottom segment may include different work function layer arrangement or different dipole components. Five cross-sectional lines are marked in FIG. 4. Line A-A's cuts through the active region 204 along its lengthwise direction (i.e., Y direction). Line B-B cuts through the vertical contact feature 260 and the opening 262. Line C-C' cuts through a gate structure 250 along its lengthwise direction (i.e., X direction). Line D-D' cuts through the vertical contact feature 260 along the X direction. Line E-E's cuts through the opening 262 along the X direction.

Figure 5:
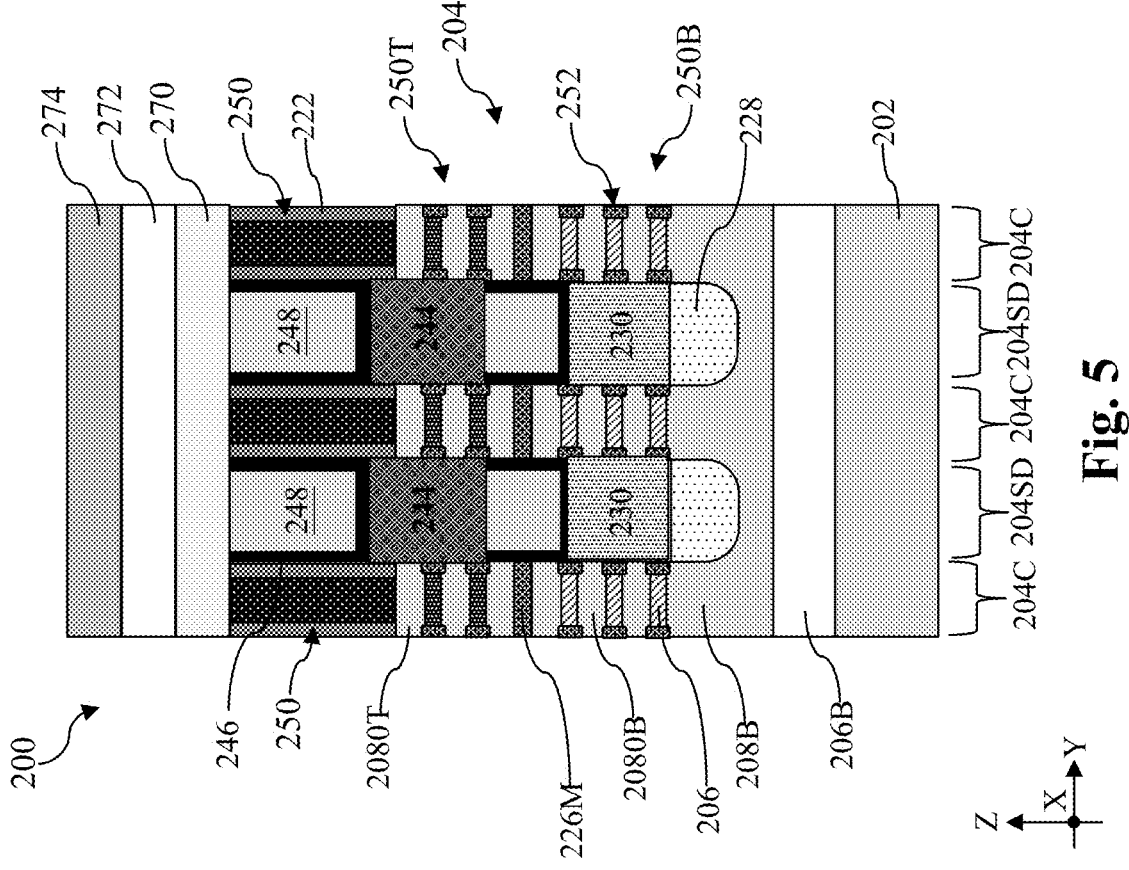
FIG. 5 illustrates a fragmentary cross-sectional view of the workpiece 200 in FIG. 4 along line A-A', according to one or more aspects of the present disclosure.

FIG. 5 illustrates a fragmentary cross-sectional view of the workpiece 200 along line A-A' in FIG. 4. FIG. 5 illustrates more C-FET structures fabricated on the workpiece 200. The workpiece 200 includes a substrate 202. The substrate 202 is similar to the substrate described above in conjunction with FIG. 3 and detailed description of the substrate 202 is omitted. In one embodiment, the substrate 202 includes silicon (Si). The workpiece 200 includes a bottom silicon germanium layer 206B over the substrate 202 and a bottom silicon layer 208B over the bottom silicon germanium layer 206B. The active region 204 includes a plurality of channel members, including bottom channel members 2080B and top channel members 2080T. In some embodiments, both bottom channel members 2080B and the top channel members 2080T include silicon. A middle dielectric isolation feature 226M is disposed between the topmost one of the bottom channel members 2080B and a bottommost one of the top channel members 2080T. The middle dielectric isolation feature 226M may include silicon oxide, silicon nitride, or a combination thereof. Each of the gate structures 250 includes a bottom segment 250B and a top segment 250T. In some embodiments, the bottom segments 250B includes a p-type work function metal layer and the top segment 250T includes n-type work function metal layer. In some alternative embodiments, the bottom segments 250B includes an n-type work function metal layer and the top segment 250T includes a p-type work function metal layer. The gate structures 250 wraps around the bottom channel members 2080B and the top channel members 2080T in the channel regions 204C. Along the Y direction, the channel regions 204C are interleaved by source/drain regions 204SD. The workpiece 200 includes bottom source/drain features 230 and top source/drain features 244. In some embodiments, the bottom source/drain features 230 include silicon germanium (SiGe) and a p-type dopant and the top source/drain features 244 include silicon (Si) and an n-type dopant. Over the active region 204, a gate spacer layer 222 extends along sidewall of the gate structures 250. The gate structures 250, including the bottom segment 250B and the top segment 250T, are insulated from the bottom source/drain features 230 and top source/drain features 244 by inner spacer features 252. The bottom source/drain features 230 are spaced apart from the bottom silicon layer 208B by a leakage blocking layer.

The workpiece 200 in FIG. 5 also includes a top contact etch stop layer (CESL) 246 over the top source/drain features 244 and a top interlayer dielectric (ILD) layer 248 over the top CESL 246. A first hard mask layer 270 is deposited over the top ILD layer 248 and the gate structure 250. A second hard mask layer 272 is disposed on the first hard mask layer 270. A third mask layer 274 is deposited over the second hard mask layer 272. In some embodiments, the first hard mask layer 270 includes silicon nitride and the second hard mask layer 272 includes silicon oxide. The third hard mask layer 274 may include silicon nitride. The top CESL 246 may include silicon nitride and the top ILD layer 248 may include silicon oxide.

Figure 6:
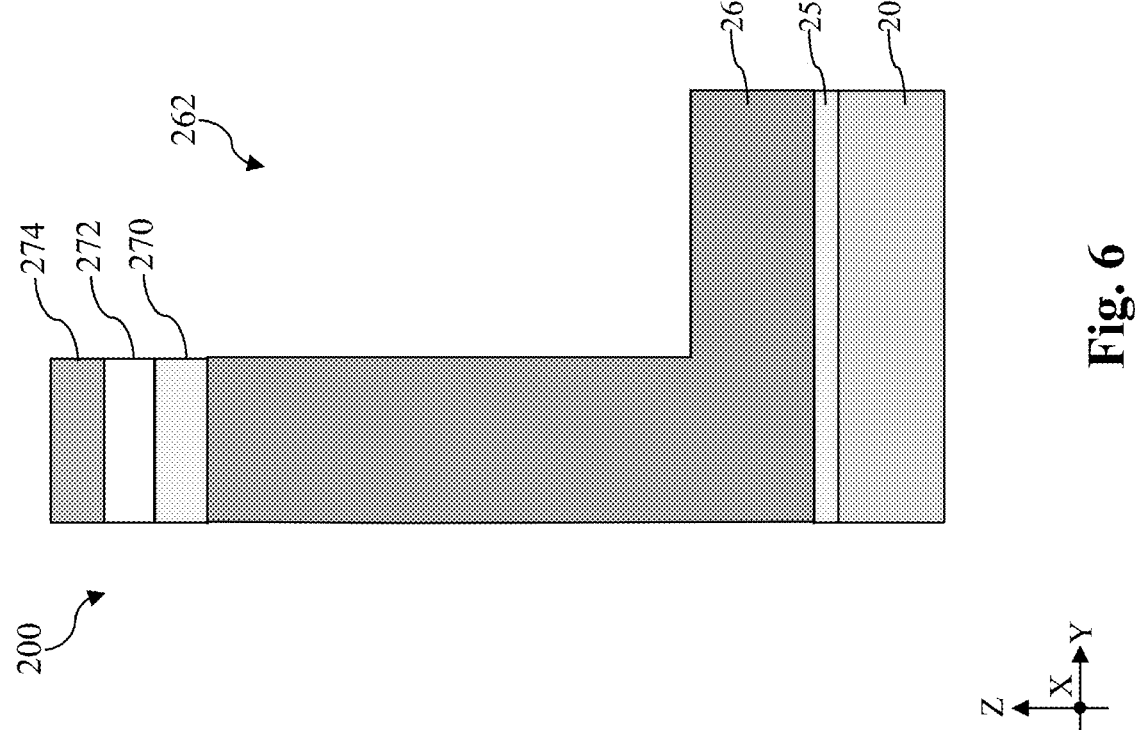
FIG. 6 illustrates a fragmentary cross-sectional view of the workpiece 200 in FIG. 4 along line B-B', according to one or more aspects of the present disclosure.

FIG. 6 illustrates a fragmentary cross-sectional view of the workpiece 200 along line B-B' in FIG. 4. FIG. 6 illustrates that the vertical contact feature 260 includes an L shape when viewed along the X direction and is vertically spaced apart from the substrate 202 by a liner 258. In some implementations, the liner 258 includes silicon nitride. With the first hard mask layer 270, the second hard mask layer 272 and the third hard mask layer 274 covering a portion of the vertical contact feature 260, the opening 262 extends into the vertical contact feature 260 but does not extend through a horizontal portion of the vertical contact feature 260. As shown in FIG. 6, the opening 262 may have a high aspect ratio, such as one between about 4 and about 12. The vertical contact feature 260 may include ruthenium (Ru), nickel (Ni), cobalt (Co), copper (Cu), or a combination thereof.

Figure 7:
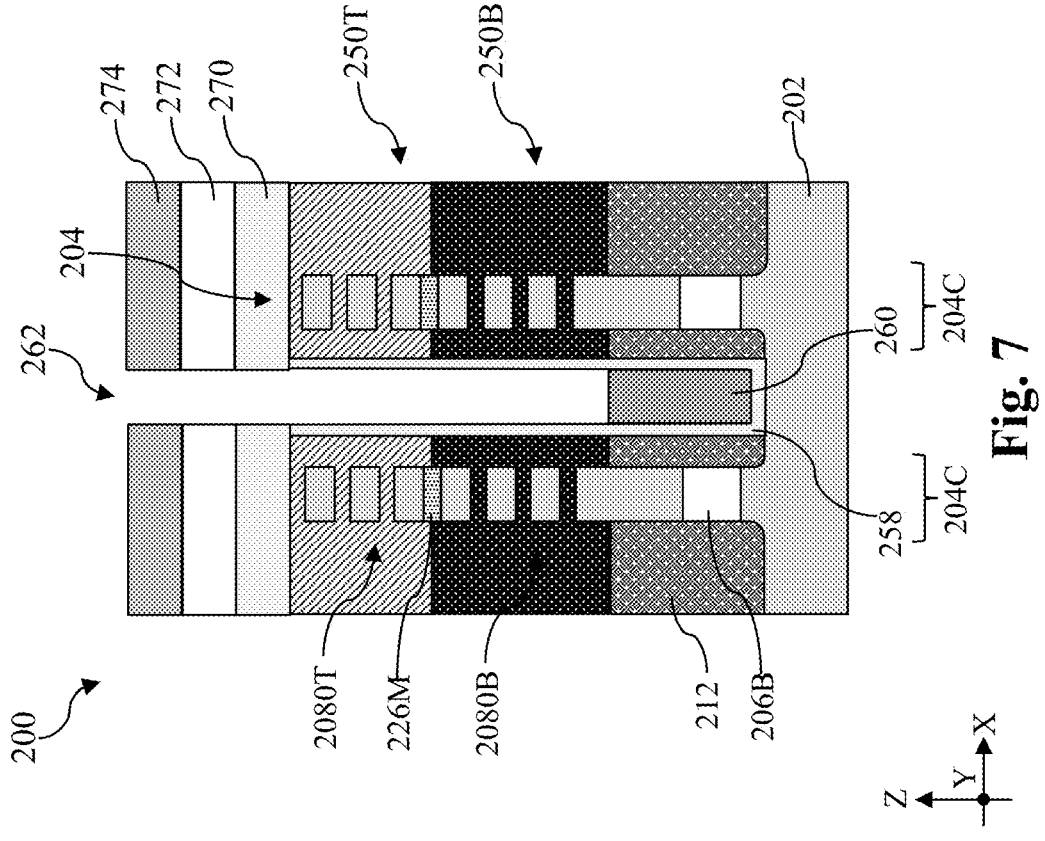
FIG. 7 illustrates a fragmentary cross-sectional view of the workpiece 200 in FIG. 4 along line C-C', according to one or more aspects of the present disclosure.

FIG. 7 illustrates a fragmentary cross-sectional view of the workpiece 200 along line C-C' in FIG. 4 over the channel region 204C. FIG. 7 illustrates that a bottom portion of the active region 204 is surrounded by an isolation feature 212, which is also disposed on a to surface of the substrate 202. The opening 262 extends vertically through the gate structure 250, including the bottom segment 250B and the top segment 250T. The opening 262 and the horizontal portion of the vertical contact feature 260 are spaced apart from the gate structure 250 and the isolation feature 212 by the liner 258.

Figure 8:
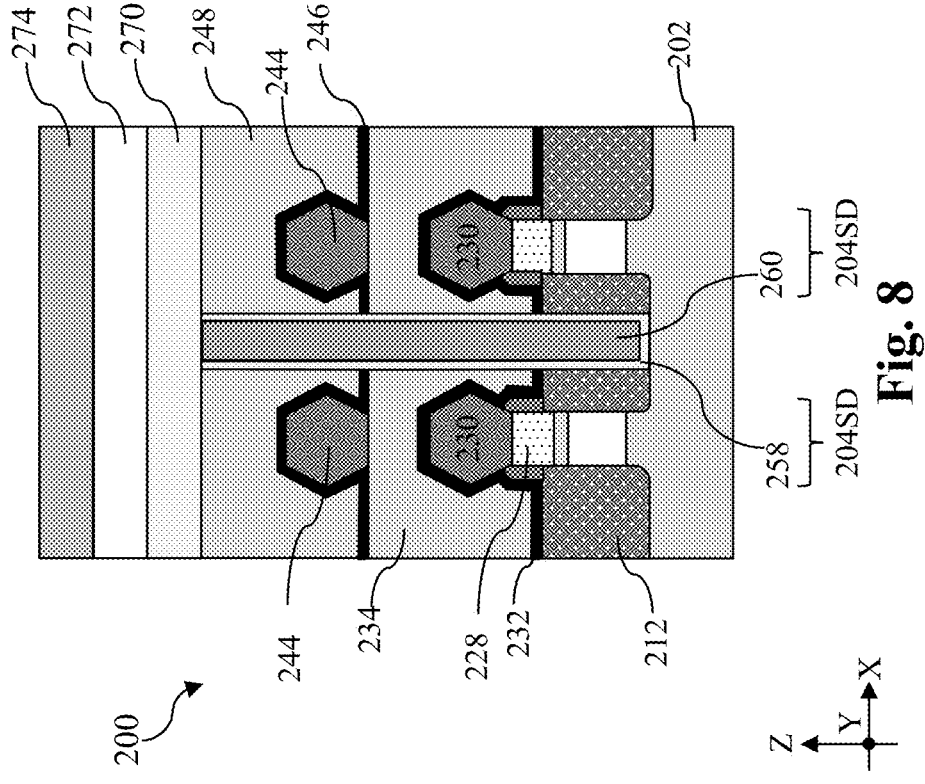
FIG. 8 illustrates a fragmentary cross-sectional view of the workpiece 200 in FIG. 4 along line D-D', according to one or more aspects of the present disclosure.

FIG. 8 illustrates a fragmentary cross-sectional view of the workpiece 200 along line D-D' in FIG. 4 over the source/drain region 204SD. The opening 262 is not present along line D-D' and the vertical contact feature 260 and the liner 258 extends between two bottom source/drain features 230 along the X direction and between two top source/drain features 244 along the X direction. As shown in FIG. 8, the bottom source/drain features 230 are covered by a bottom CESL 232 and a bottom ILD layer 234. As described above, the top source/drain features 244 are covered by the top CESL 246 and the top ILD layer 248. The liner 258 are in direct contact with sidewalls of the isolation feature 212, the bottom CESL 232, the bottom ILD layer 234, the top CESL 246, and the top ILD layer 248.

Figure 9:
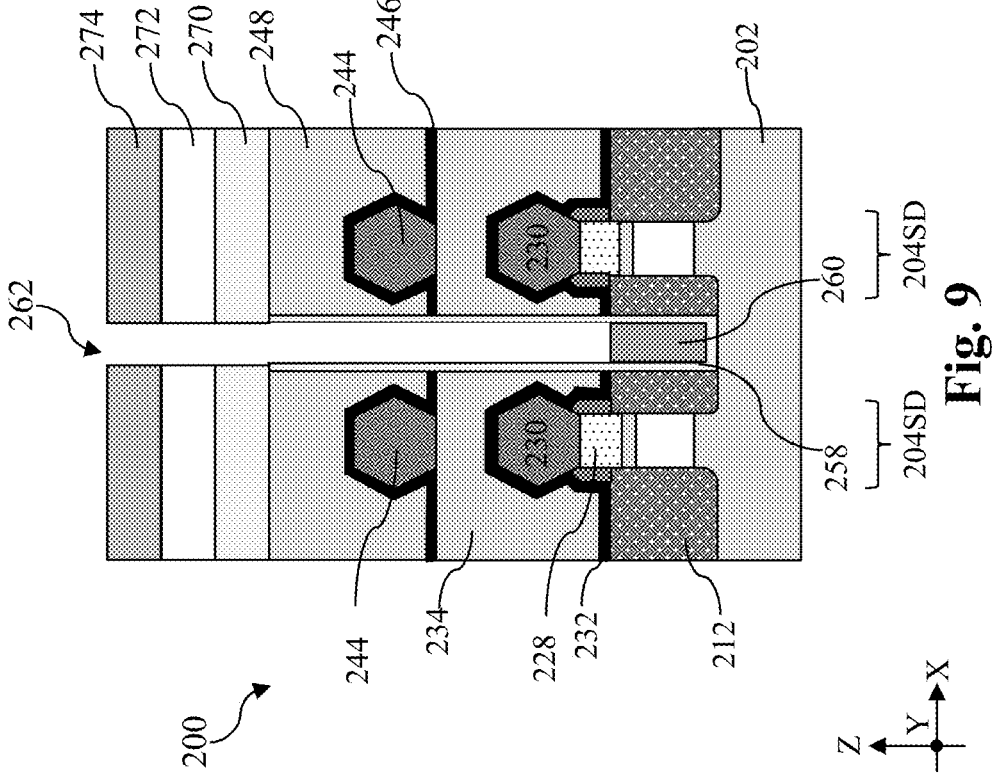
FIG. 9 illustrates a fragmentary cross-sectional view of the workpiece 200 in FIG. 4 along line E-E', according to one or more aspects of the present disclosure.

FIG. 9 illustrates a fragmentary cross-sectional view of the workpiece 200 along line E-E' in FIG. 4. The opening 262 is shown in FIG. 9. Along the vertical direction (Z direction), the opening 262 extends through the third hard mask layer 274, the second hard mask layer 272, the first hard mask layer 270, the top ILD layer 248, the top CESL 246, the bottom ILD layer 234, and the bottom CESL 232. The opening 262 terminates at a top surface of the horizontal portion of the L-shaped vertical contact feature 260. The opening 262 is spaced apart from the top ILD layer 248, the top CESL 246, the bottom ILD layer 234, and the bottom CESL 232 by the liner 258. As shown in FIG. 9, the opening 262 has a high aspect ratio.

Figure 10:
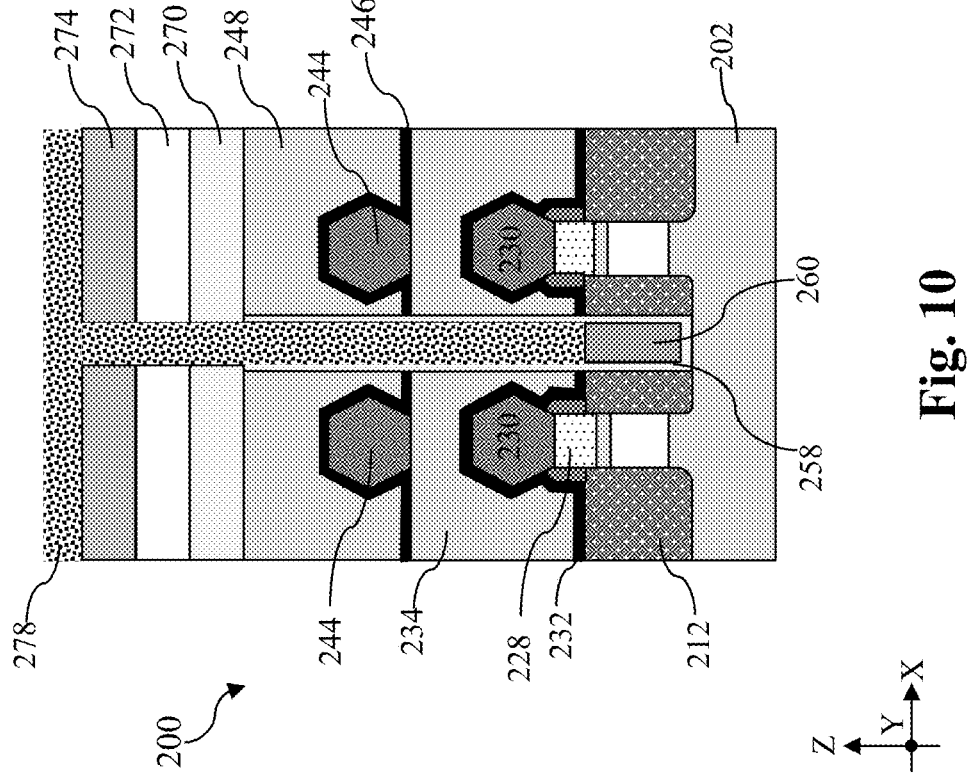
FIG. 10 illustrates a fragmentary cross-sectional view of the workpiece 200 in FIG. 4 along line E-E' where a dielectric material is deposited, according to one or more aspects of the present disclosure.

FIG. 10 illustrates a fragmentary cross-sectional view of the first semiconductor structure in FIG. 4 along line E-E' where a dielectric material 278 is deposited over the workpiece 200, including over the opening 262. The dielectric material 278 includes silicon (Si) and oxygen (O). The dielectric material 278 may also include other elements, such as carbon (C), hydrogen (H), or nitrogen (N). In some embodiments, the dielectric material 278 includes silicon oxide, silicon oxynitride, silicon oxycarbide, or silicon oxycarbonitride. In the depicted embodiments, the dielectric material 278 includes silicon oxide. The dielectric material 278 may be deposited using spin-on coating, ALD, CVD, FCVD, or a suitable method. The deposition of the dielectric material 278 corresponds to operations at block 104 of method 100.

Figure 11:
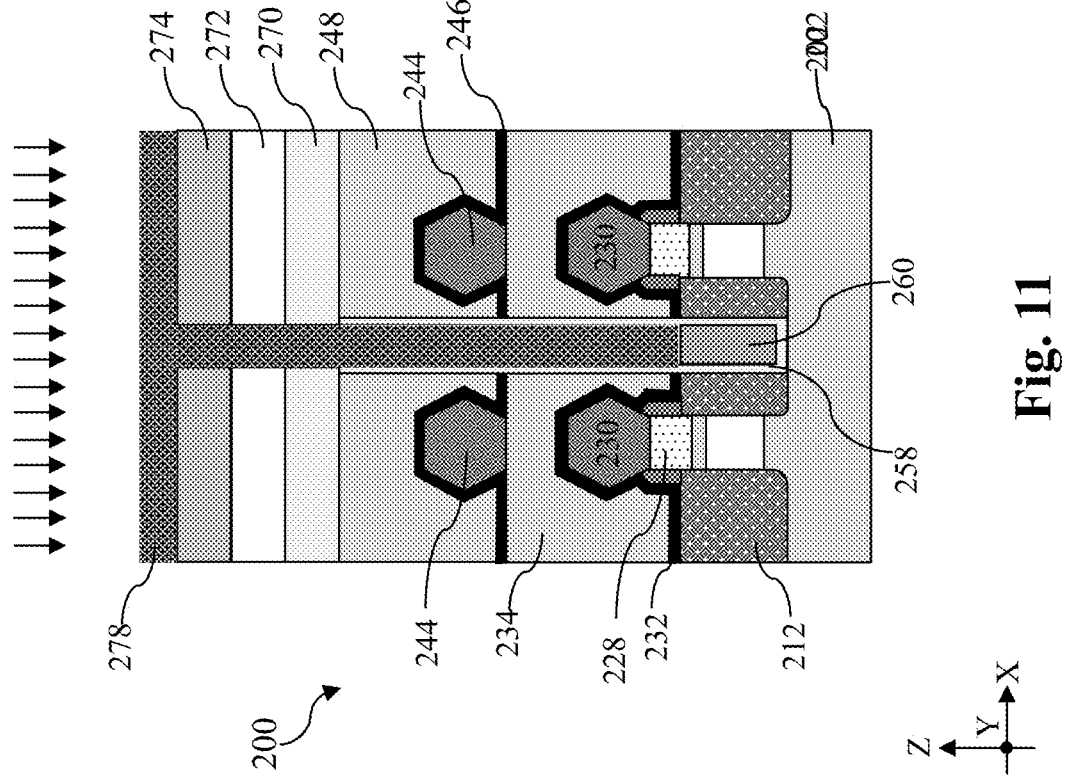
FIG. 11 illustrates a fragmentary cross-sectional view of the workpiece 200 in FIG. 4 along line E-E' where the dielectric material is being treated using the treatment system in FIG. 1, according to one or more aspects of the present disclosure.

FIG. 11 illustrates a fragmentary cross-sectional view of the workpiece 200 along line E-E', wherein the dielectric material 278 is being treated using the treatment system 10 in FIG. 1. Hydrogen radical, oxygen radical, or hydroxyl radical carried by supercritical carbon dioxide is directed to a process chamber where the workpiece 200 is placed. With the help of the zero surface tension and high permeability of the supercritical carbon dioxide, hydrogen radical, oxygen radical, or hydroxyl radical is brought into contact with dielectric material 278. As described above in conjunction with FIG. 2, the radicals cause formation of cage form or network form Si—O—Si bonding and densify the dielectric material 278. For illustration purposes, the treated dielectric material 278 is illustrated in a denser pattern.

Figure 12:
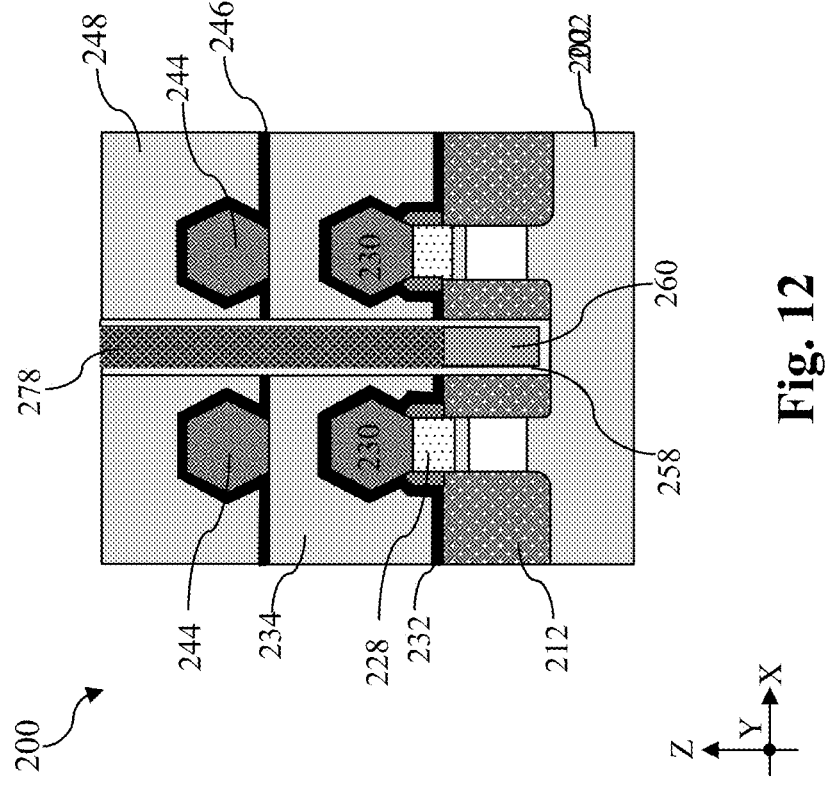
FIG. 12 illustrates a fragmentary cross-sectional view of the workpiece 200 along line E-E' where the treated dielectric material is subjected to a planarization process, according to one or more aspects of the present disclosure.

FIG. 12 illustrates a fragmentary cross-sectional view of the workpiece 200 along line E-E' in FIG. 4, where the treated dielectric material 278 is subjected to a planarization process. In some embodiments, the workpiece 200 is planarized using a chemical mechanical polishing (CMP). As shown in FIG. 12, the planarization removes excess dielectric material 278, the third hard mask layer 274, the second hard mask layer 272, the first hard mask layer 270, and a portion of the top ILD layer 248. Because the treated dielectric material 278 is densified with the treatment, the planarized dielectric material 278 has a planar top surface and exhibit little or no dishing.

It noted that when the dielectric material 278 is treated, the gate structures 250 have already been formed. Gate structures 250 are known to be sensitive to thermal treatment and that is the reason why they are usually formed towards the end of a fabrication process. For example, in a gate replacement process, a dummy gate stack formed of polysilicon is formed as a placeholder and is later replaced with a metal gate structure after thermal processes are substantially performed. This is where the treatment of the present disclosure comes in. If an anneal process or a steam anneal process with a high temperature (greater than 500° C.) is performed to treat the dielectric material, the high heat and steam may damage the gate structures 250 in terms of threshold voltage shifting or degradation of On-state current. Because the supercritical carbon dioxide is at a temperature between about 100° C. and about 200° C., the dielectric material 278 can be treated while the gate structures 250 are not damaged.

While not explicitly shown in the figures, the treatment system 10 in FIG. 1 may also be used to treat the top ILD layer 248. As shown in FIG. 12, the top ILD layer 248 is subjected to planarization. Treating the top ILD layer 248 with the low thermal budget treatment process of the present disclosure definitely helps reduce the thermal budget. While the structures in the workpiece 200 are fabricated using a process where the top ILD layer 248 are formed before the gate structures 250 are formed, the top ILD layer 248 may be formed after the gate structures 250 are formed using a different process. Further still, the hydrogen radical, oxygen radical, or hydroxyl radical may lower the dielectric constant of the top CESL 246. The top CESL 246 may include silicon nitride, which has a dielectric constant between about 6.4 and 7. Introduction of oxygen by the oxygen radical may lower its dielectric constant, thereby reducing parasitic capacitance.

As described above, the top segment 250T and the bottom segment 250B have different compositions. For that reason, they require differentiated treatments. The differentiated treatments are enabled by use of dummy fill layers. These dummy fill layers are deposited and patterned to cover the bottom channel members 2080B while materials are deposited around the top channel members 2080T. For example, a dummy fill layer may be formed when different work function layers are deposited. For another example, a dummy fill layer may be formed when different dipole layers are deposited. Because the dummy fill layer is usually formed to cover the bottom channel members 2080B, it is usually deposited to cover both the top channel members 2080T and the bottom channel members 2080B and then etched back. Because the dummy fill layer is formed after some gate layers are deposited and is subjected to an etch back process, it too requires a low-thermal-budget treatment. The treatment ensures that the dummy fill layer may be etched back uniformly at a predictable rate.

Figure 13:
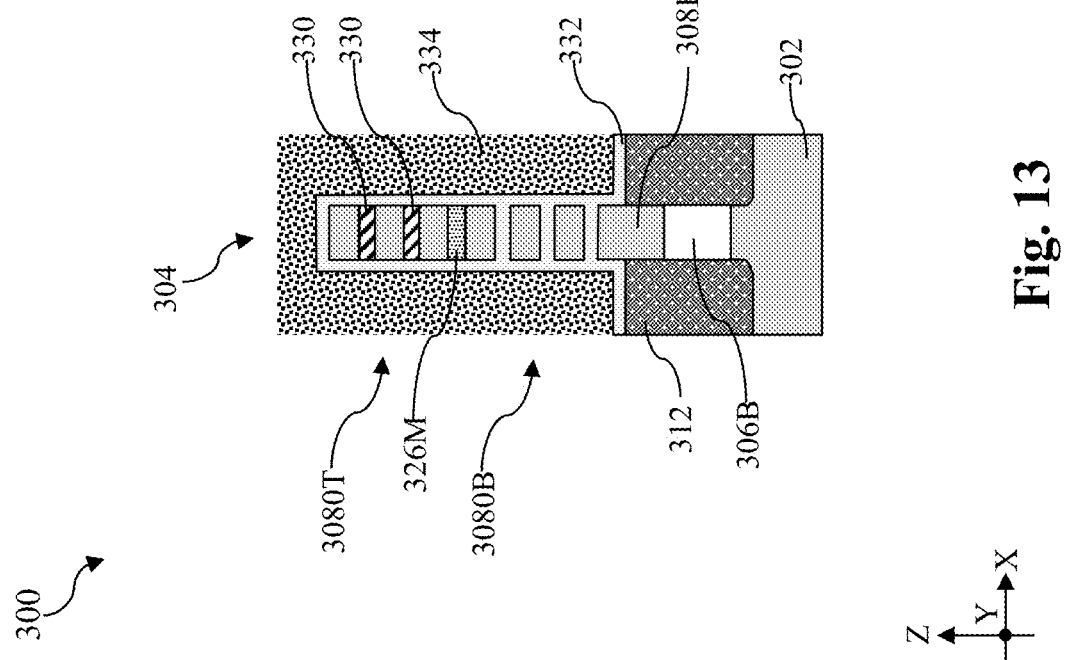
FIG. 13 illustrates a fragmentary cross-sectional view of a workpiece 300 and a dielectric material deposited thereon, according to one or more aspects of the present disclosure.

FIGS. 13-17 illustrate application of the treatment system 10 in FIG. 1 or method 100 in FIG. 3 to a first dummy fill material 336 during deposition of more than one work function layers when forming a C-FET. Reference is first made to FIG. 13. FIG. 13 illustrates a workpiece 300. The workpiece 300 includes a substrate 302 and a fin-shaped structure 304 over the substrate 302. The fin-shaped structure 304 includes a bottom silicon germanium layer 306B and a bottom silicon layer 308B over the bottom silicon germanium layer 306B. A base portion of the fin-shaped structure 304 is surrounded by an isolation feature 312. Like the active region 204 described above, the fin-shaped structure 304 also include a plurality of bottom channel members 3080B and a plurality of top channel members 3080T. A middle dielectric isolation feature 326M is disposed between the topmost one of the bottom channel members 3080B and a bottommost one of the top channel members 3080T. The middle dielectric isolation feature 326M may include silicon oxide, silicon nitride, or a combination thereof. As shown in FIG. 13, a first work function layer 332 is deposited to wrap around each of the bottom channel members 3080B. Because the spaces between the top channel members 3080T are filled by a plug dielectric material 330, the first work function layer 332 only wraps over a top surface and sidewalls of the top channel members 3080T. For selective deposition, the first dummy fill material 336 is deposited over the first work function layer 332. The first dummy fill material 336 includes silicon (Si) and oxygen (O). The first dummy fill material 336 may also include other elements, such as carbon (C), hydrogen (H) or nitrogen (N). In some embodiments, the first dummy fill material 336 includes silicon oxide, silicon oxynitride, silicon oxycarbide, or silicon oxycarbonitride. In one embodiment, the dummy fill material 336 is a bottom antireflective coating (BARC) layer and may include silicon (Si), oxygen (O), carbon (C), and hydrogen (H).

Figure 14:
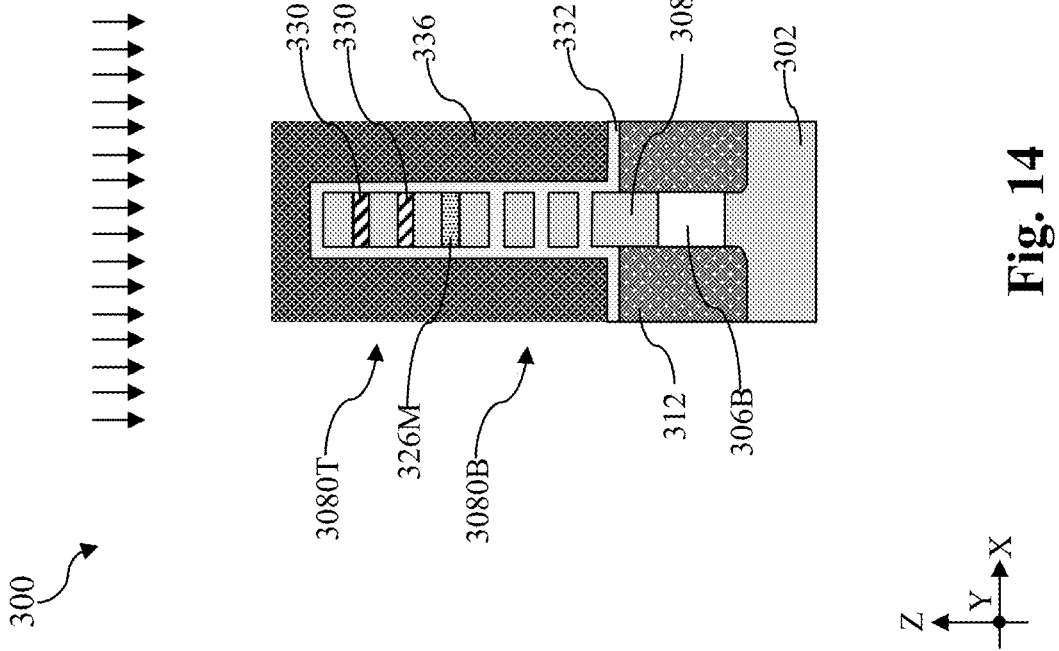
FIG. 14 illustrates a fragmentary cross-sectional view of the workpiece 300 in FIG. 13 where the dielectric material is treated using the treatment system in FIG. 1, according to one or more aspects of the present disclosure.
Figure 15:
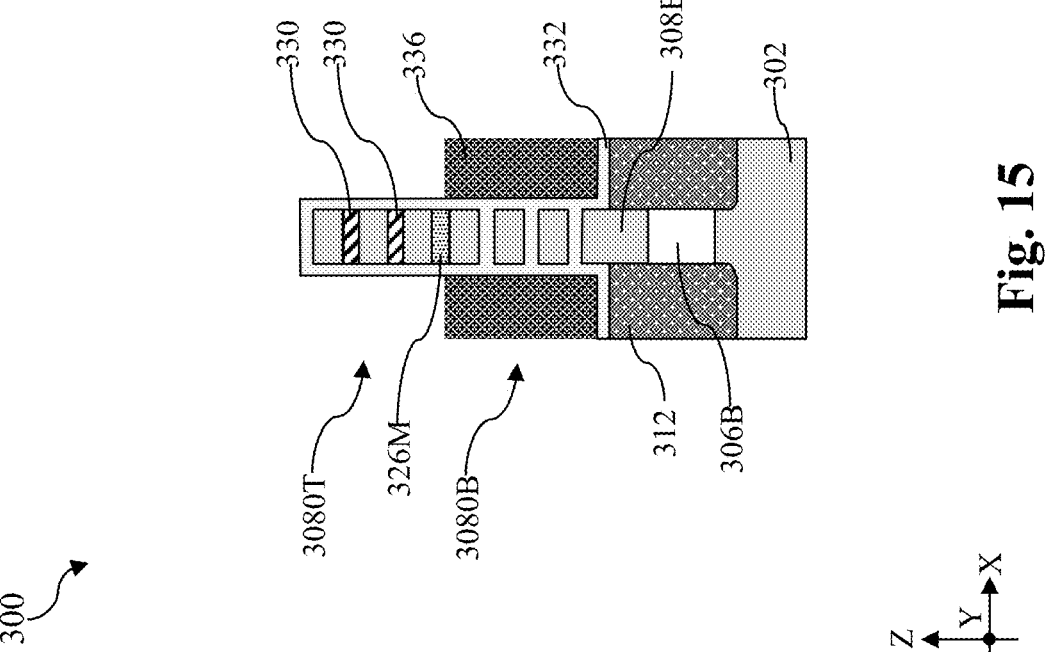
FIG. 15 illustrates a fragmentary cross-sectional view of the workpiece 300 in FIG. 13 where the treated dielectric material is etched back, according to one or more aspects of the present disclosure.

Referring to FIG. 14, the first dummy fill material 336 is treated using the treatment system 10 shown in FIG. 1. The treated first dummy fill material 336 is densified and is illustrated using a denser pattern. Referring then to FIG. 15, the treated first dummy fill material 336 is anisotropically etched back using an anisotropic dry etch process until a top surface of the treated first dummy fill material 336 is at or around the level of the middle dielectric isolation feature 326M. In other words, after the etching back, the top surface of the treated first dummy fill material 336 is below the bottom surface of the bottommost one of the top channel members 3080T.

Figure 16:
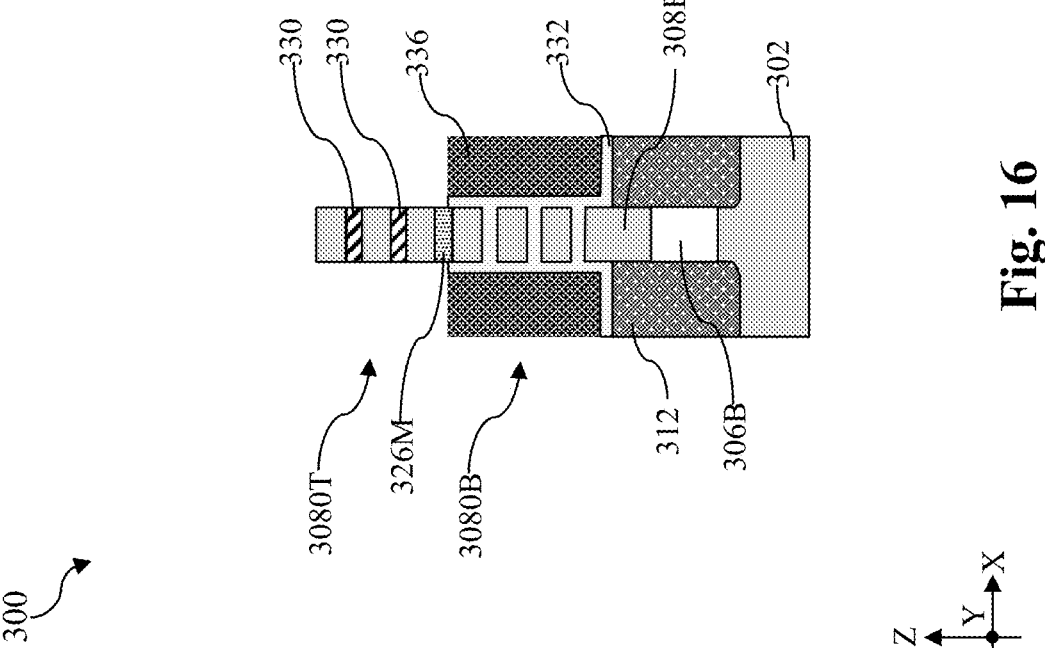
FIG. 16 illustrates a fragmentary cross-sectional view of the workpiece 300 in FIG. 15 where a portion of a first work function layer is removed, according to one or more aspects of the present disclosure.
Figure 17:
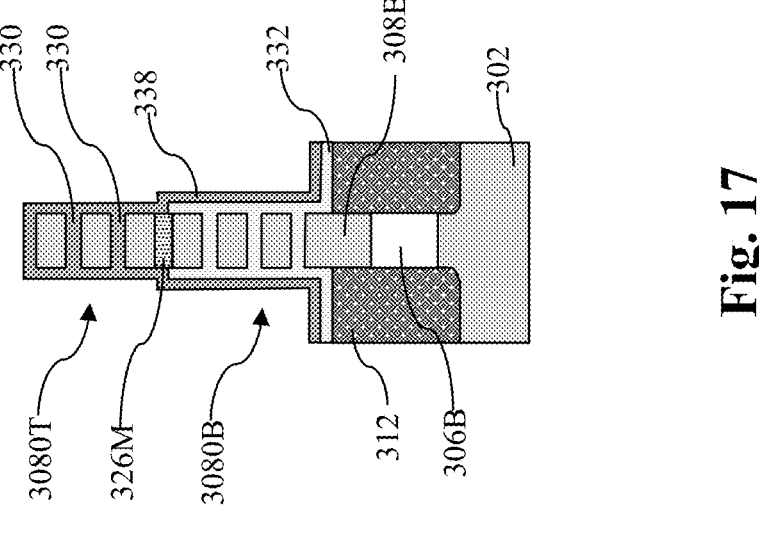
FIG. 17 illustrates a fragmentary cross-sectional view of the workpiece 300 in FIG. 16 where the treated dielectric material is removed and a second work function layer is deposited, according to one or more aspects of the present disclosure.
Figure 17:
Figure 17:
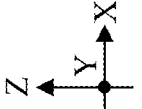

Reference is then made to FIG. 16. With the bottom channel members 3080B covered by the first dummy fill material 336, the exposed first work function layer 332 is removed, exposing the top surface and sidewalls of the top channel members 3080T. Referring to FIG. 17, the first dummy fill material 336 and the plug dielectric material 330 are then removed by selective etching, such as a wet etching process. The removal of the plug dielectric material 330 releases the top channel members 3080T and frees up the spaces among the top channel members 3080T. Thereafter, a second work function layer 338 is then deposited over the first work function layer 332. The second work function layer 338 is allowed to wrap around each of the top channel members 3080T. It is noted that, due to the presence of middle dielectric isolation feature 326M, the first work function layer 332 and the second work function layer 338 may not wrap completely around the topmost channel member in the bottom channel members 3080B or the bottommost channel member in the top channel members 3080T.

The first work function layer 332 and the second work function layer 338 have different compositions. In one embodiment, the first work function layer 332 is a p-type work function layer and the second work function layer 338 is an n-type work function layer. In another example, the first work function layer 332 is an n-type work function layer and the second work function layer 338 is a p-type work function layer. Example n-type work function materials include Ti, Al, Ag, Mn, Zr, TiAl, TiAlC, TaC, TaCN, TaSiN, TaAl, TaAlC, or TiAlN. Example p-type work function materials include TiN, TaN, Ru, Mo, Al, WN, $ZrSi_2$, $MoSi_2$, $TaSi_2$, $NiSi_2$, or WN.

Figure 18:
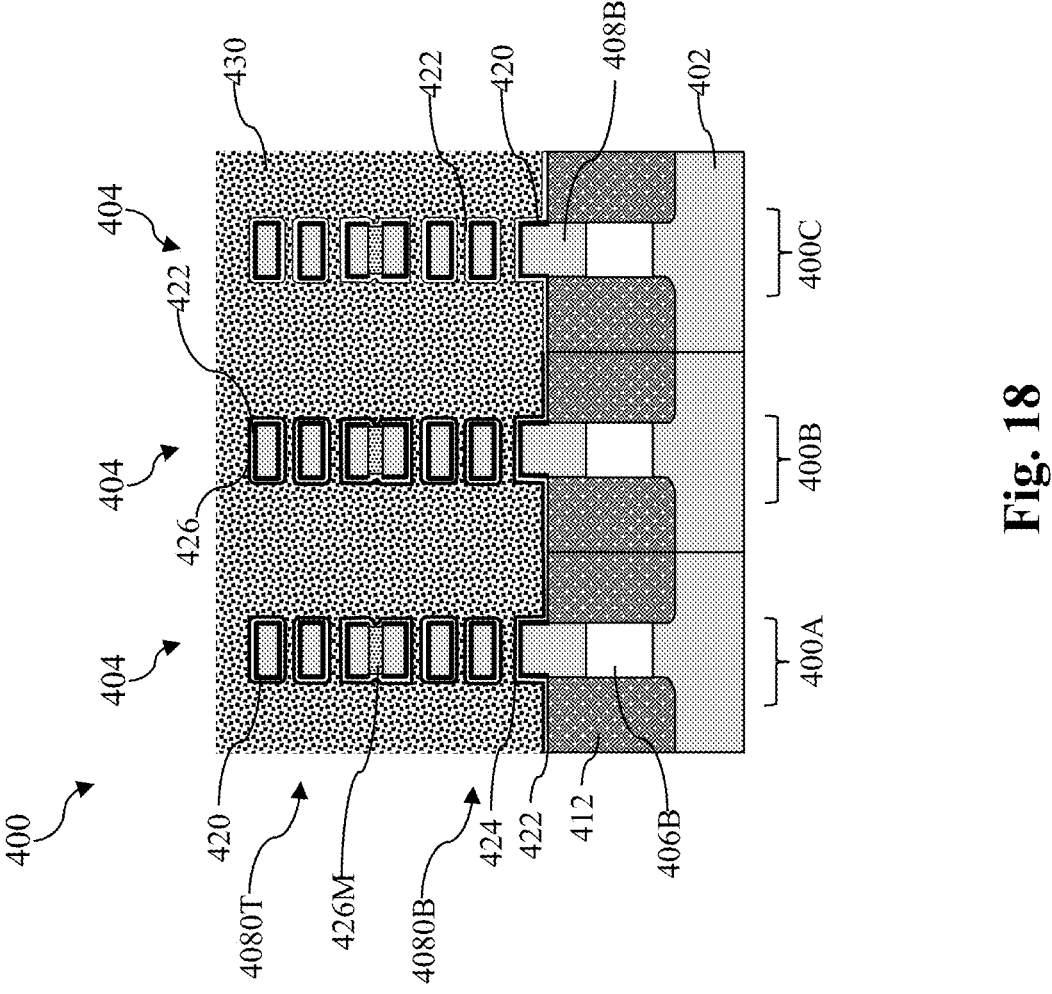
FIGS. 18-24 illustrate fragmentary cross-sectional views of a workpiece 400 where different dipole layers are introduced to top nanostructures and bottom nanostructures in different device regions, according to one or more aspects of the present disclosure.

FIGS. 18-24 illustrate application of the treatment system 10 in FIG. 1 or method 100 in FIG. 3 to a second dummy fill material 430 during a dipole driving process for a C-FET. Reference is first made to FIG. 18. FIG. 18 illustrates a workpiece 400. The workpiece 400 includes three device regions-a first region 400A, a second region 400B, and a third region 400C. The workpiece 400 includes a substrate 402 and a fin-shaped structure 404 over the substrate 402 in each of the device regions 400A, 400B, and 400C. The fin-shaped structure 404 includes a bottom silicon germanium layer 406B and a bottom silicon layer 408B over the bottom silicon germanium layer 406B. A base portion of the fin-shaped structure 404 is surrounded by an isolation feature 412. Like the active region 204 described above, the fin-shaped structure 404 includes a plurality of bottom channel members 4080B and a plurality of top channel members 4080T. A middle dielectric isolation feature 426M is disposed between the topmost one of the bottom channel members 4080B and a bottommost one of the top channel members 4080T. The middle dielectric isolation feature 426M may include silicon oxide, silicon nitride, or a combination thereof.

As shown in FIG. 18, an interfacial layer 420 is formed over surfaces of the bottom silicon layer 408B, the bottom channel members 4080B, and the top channel members 4080T using thermal oxidation. The interfacial layer 420 may include silicon oxide. A gate dielectric layer 422 is then deposited over the interfacial layer 420 and a top surface of the isolation feature 412 using CVD or ALD. The gate dielectric layer 422 may include, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. Over the first region 400A, a first dipole material 424 is conformally deposited over the gate dielectric layer 422 using ALD or CVD. Over the second region 400B, a second dipole material 426 is conformally deposited over the gate dielectric layer 422 using ALD or CVD. The first region 400A is free of the second dipole material 426. The second region 400B is free of the first dipole material 424. The third region 400C is free of both the first dipole material 424 and the second dipole material 426. In some embodiments, the first dipole material 424 and the second dipole material 426 are both n-type dipole materials and are different in terms of composition or thickness. In one embodiment, the first dipole material 424 includes lanthanum oxide while the second dipole material 426 includes yttrium oxide. In another embodiment, both the first dipole material 424 and the second dipole material include lanthanum oxide but the first dipole material 424 is thicker than the second dipole material 426 by about 20% to about 100%.

Reference is still made to FIG. 18. A second dummy fill material 430 is deposited over the first region 400A, the second region 400B and the third region 400C to cover the fin-shaped structures 404. The second dummy fill material 430 includes silicon (Si) and oxygen (O). The second dummy fill material 430 may also include other elements, such as carbon (C), hydrogen (H) or nitrogen (N). In some embodiments, the second dummy fill material 430 includes silicon oxide, silicon oxynitride, silicon oxycarbide, or silicon oxycarbonitride. In one embodiment, the second dummy fill material 430 is a bottom antireflective coating (BARC) layer and may include silicon (Si), oxygen (O), carbon (C), and hydrogen (H).

Figure 19:
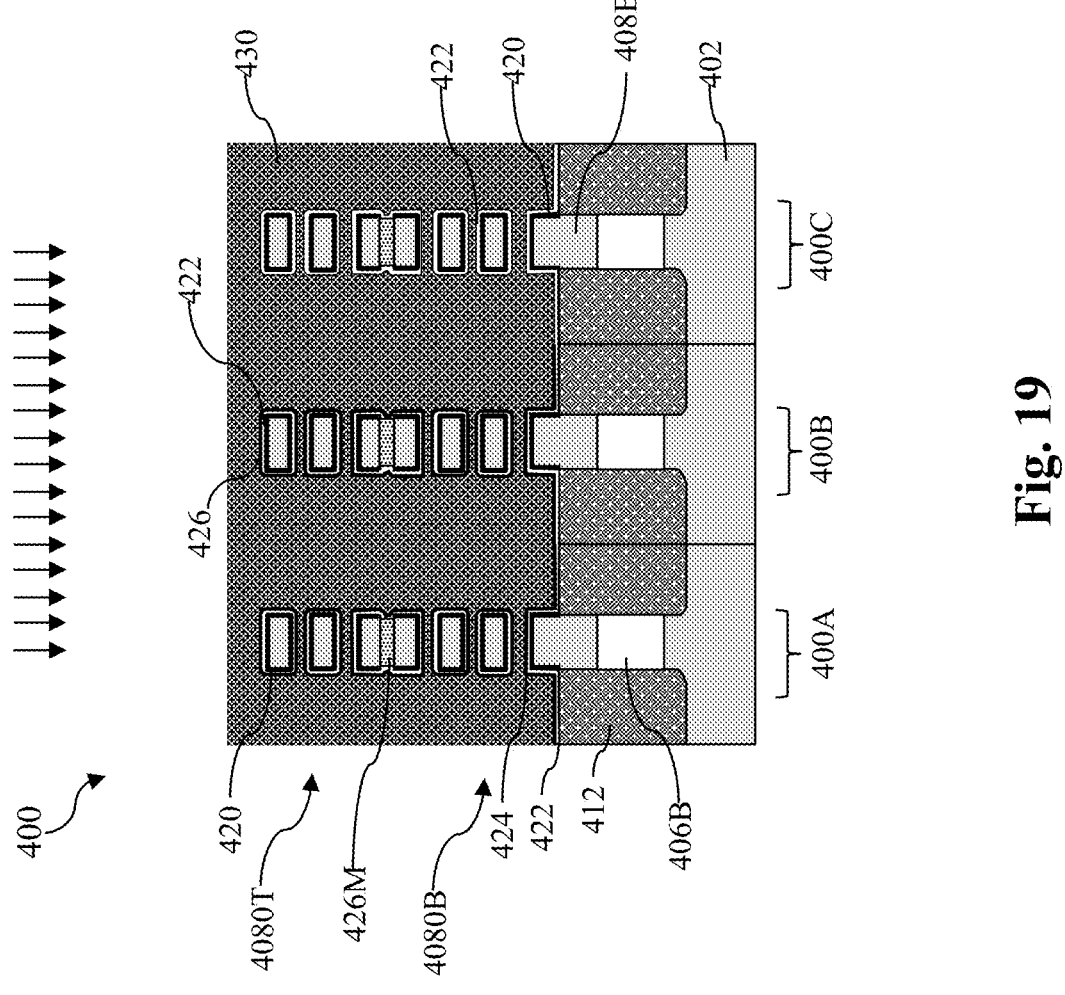
Figure 20:
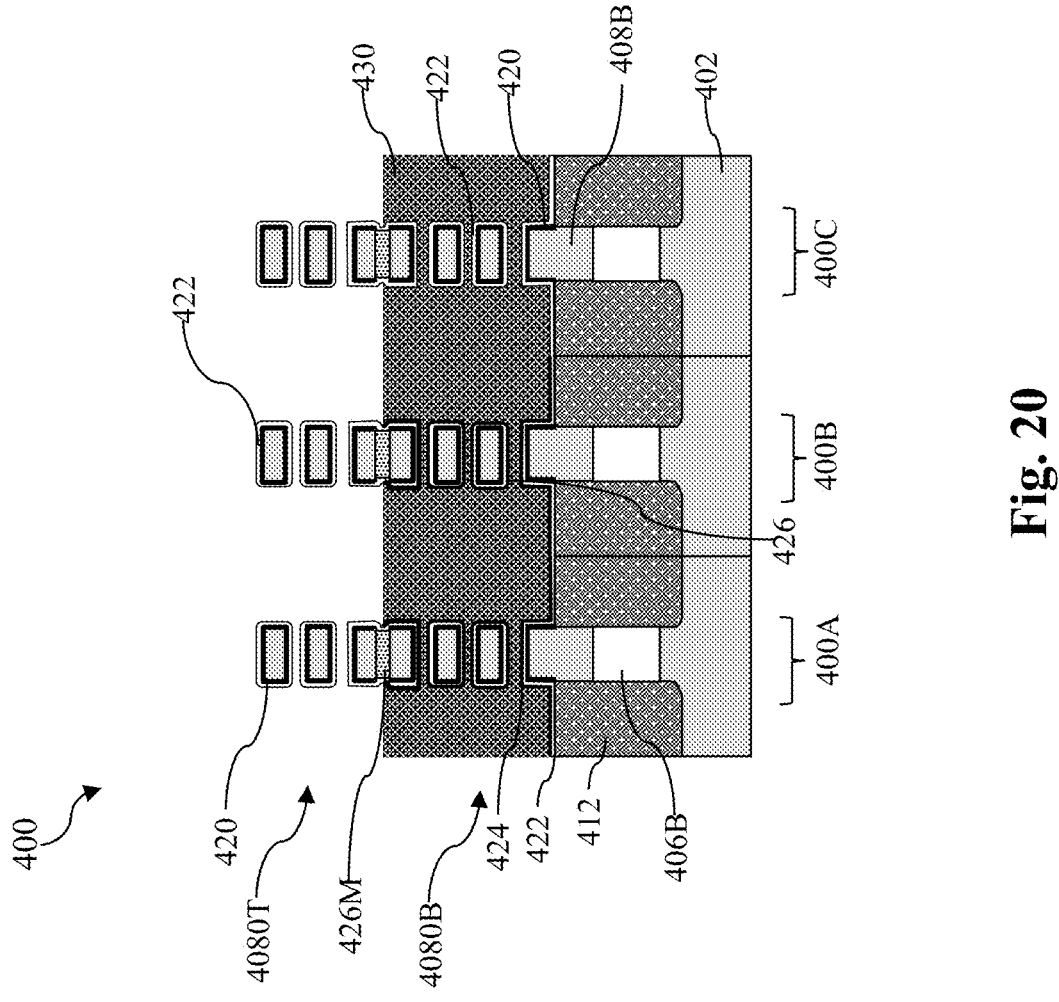

Ahead of the etching back illustrated in FIG. 20, as shown in FIG. 19, the second dummy fill material 430 is treated using the treatment system 10 in FIG. 1. The treated second dummy fill material 430 is densified and is illustrated using a denser pattern. Referring then to FIG. 20, the second dummy fill material 430 is anisotropically etched back using an anisotropic dry etch process until a top surface of the treated second dummy fill material 430 is at or around the level of the middle dielectric isolation feature 426M. In other words, after the etching back, the top surface of the treated second dummy fill material 430 is below the bottom surface of the bottommost one of the top channel members 4080T. After the etching back, the first dipole material 424 and the second dipole material 426 are removed from the top channel members 4080T in the first region 400A and the second region 400B. As shown in FIG. 20, the gate dielectric layer 422 of the top channel members 4080T are exposed.

Figure 21:
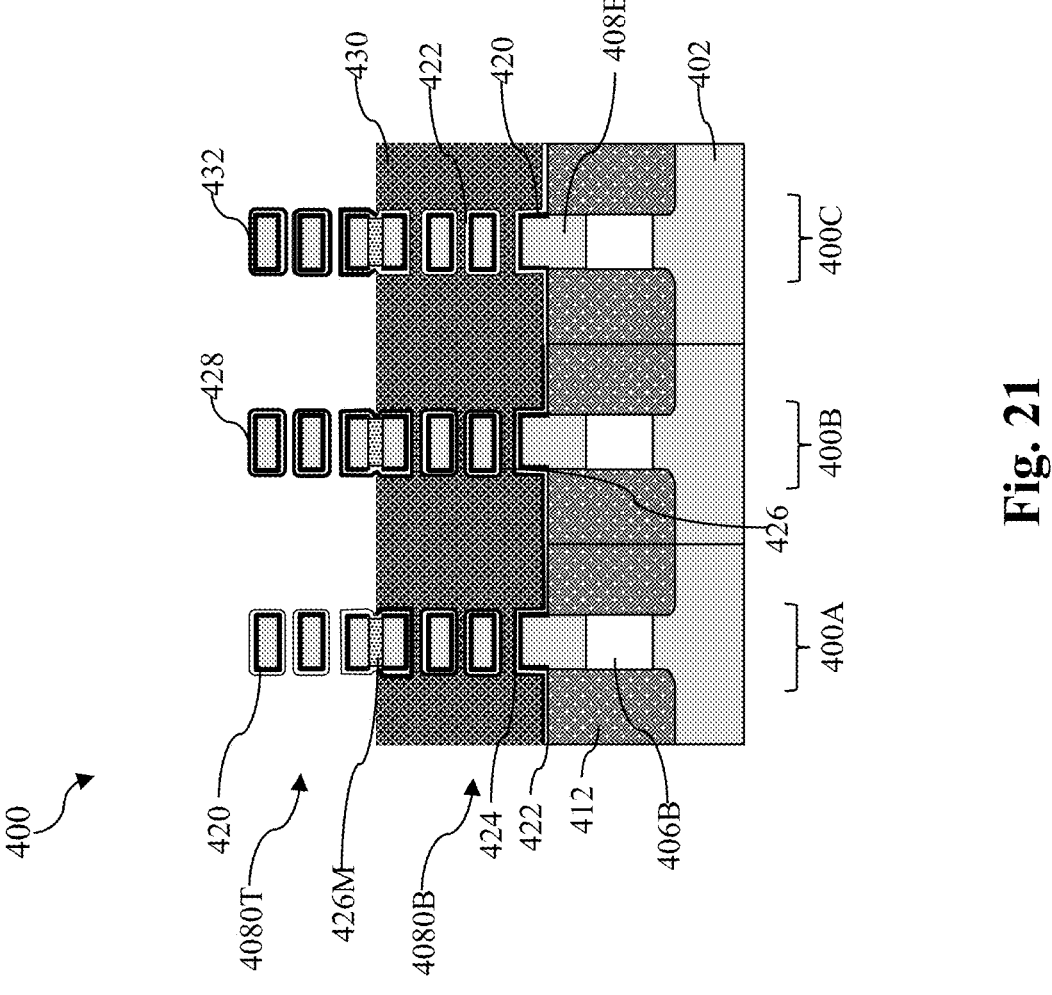
Figure 22:
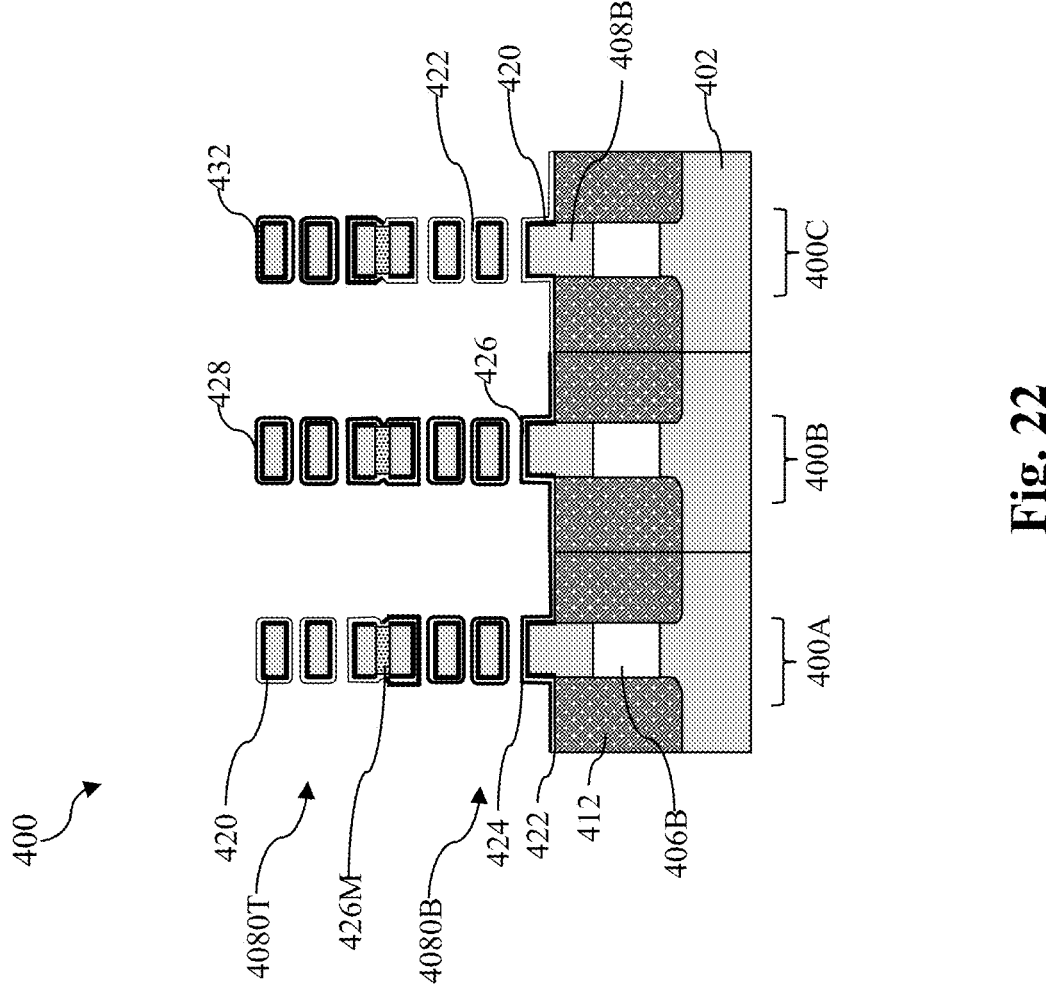

Referring to FIG. 21, a third dipole material 428 is selectively deposited to wrap around each of the top channel members 4080T in the second region 400B and a fourth dipole material 432 is selectively deposited to wrap around each of the top channel members 4080T in the third region 400C. In some embodiments, the third dipole material 428 may be similar to the second dipole material 426 and the fourth dipole material 432 may be similar to the first dipole material 424. After the selective deposition of the third dipole material 428 and the fourth dipole material 432, the second dummy fill material 430 is selectively removed by selective etching, as shown in FIG. 22. After the removal of the second dummy fill material 430, an anneal process is performed to drive in the dipole materials into the gate dielectric layer to introduce desired dipole. After the drive-in process, excess dipole material may be selectively removed.

Figure 23:
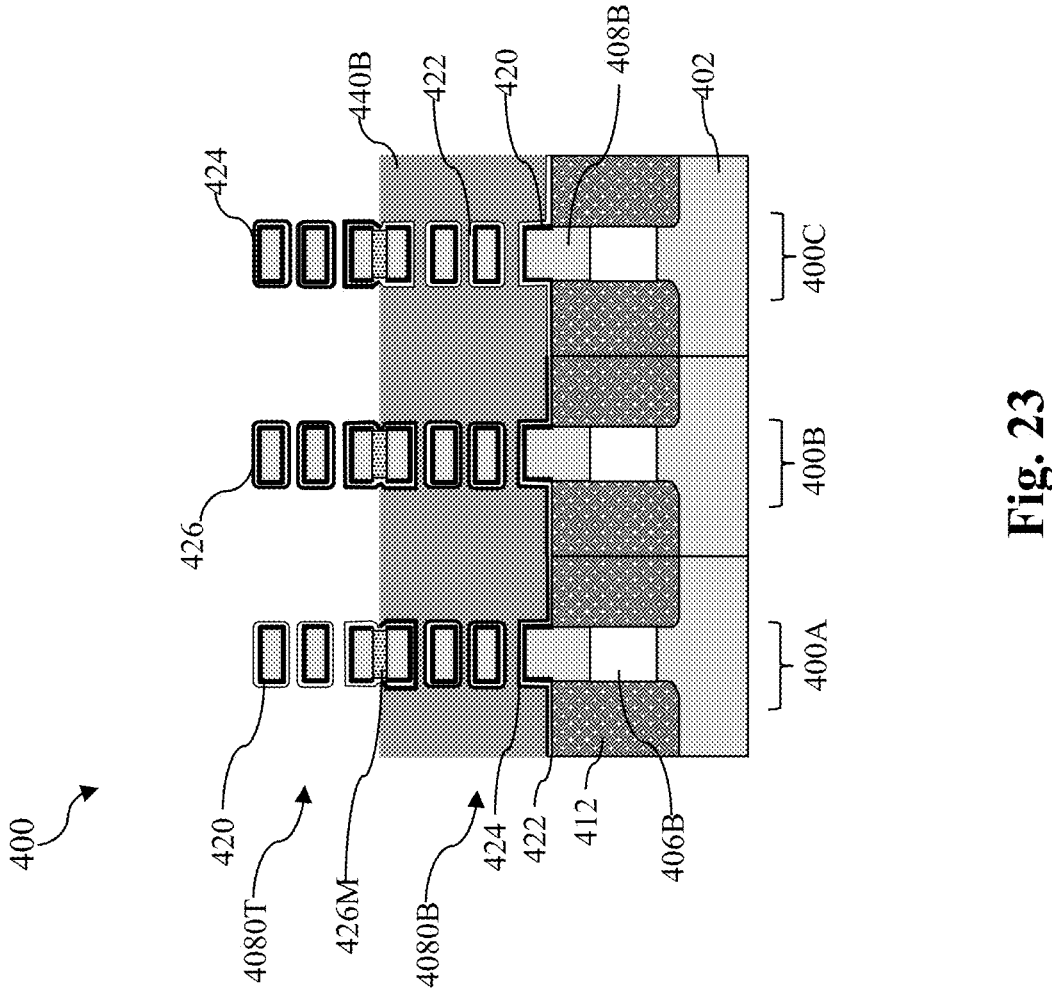
Figure 24:
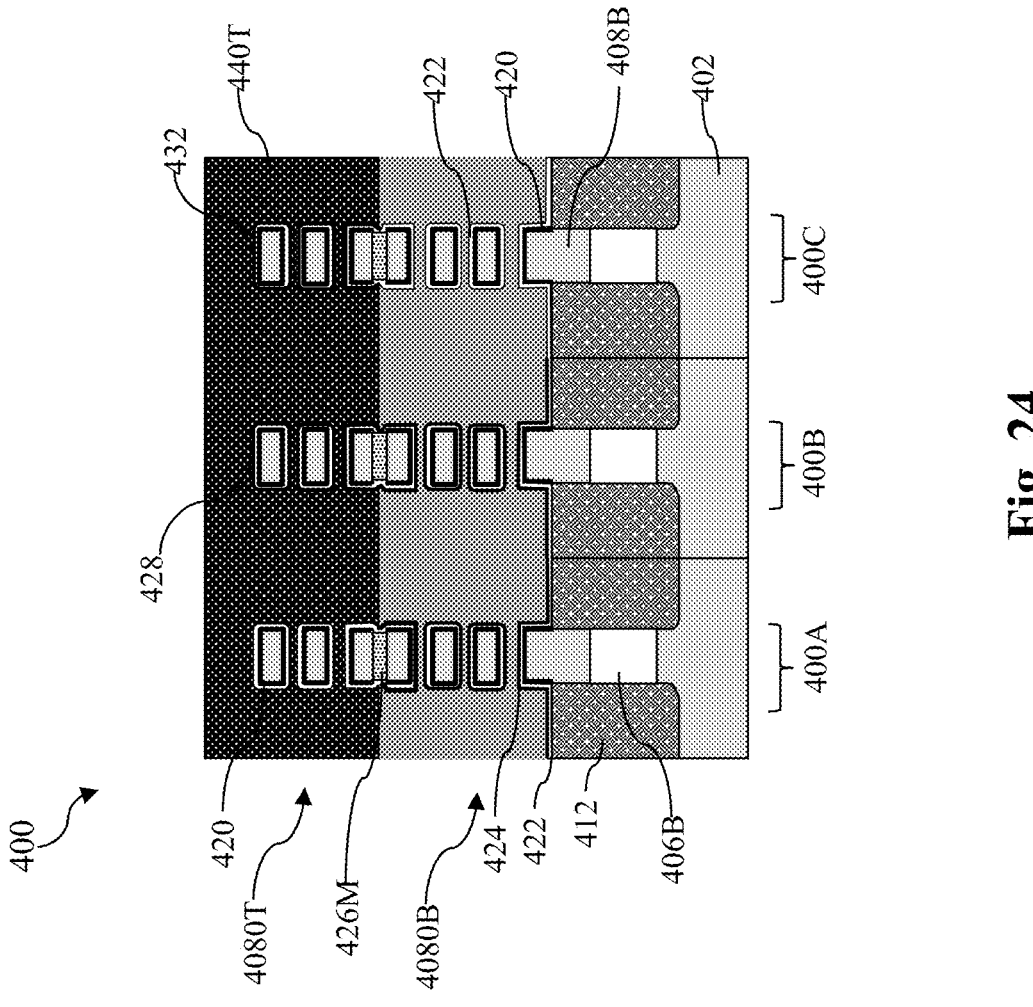

After excess dipole materials are removed, a bottom segment 440B is then deposited to wrap around the bottom channel members 4080B in all regions as shown FIG. 23. In FIG. 24, a top segment 440T is deposited to wrap around the top channel members 4080T in all regions. In some embodiments, the bottom segment 440B includes a p-type work function layer and the top segment 440T includes an n-type work function layer. Example n-type work function materials include Ti, Al, Ag, Mn, Zr, TiAl, TiAlC, TaC, TaCN, TaSiN, TaAl, TaAlC, or TiAlN. Example p-type work function materials include TiN, TaN, Ru, Mo, Al, WN, $ZrSi_2$, $MoSi_2$, $TaSi_2$, $NiSi_2$, or WN.

In one exemplary aspect, the present disclosure is directed to a method. The method includes providing a semiconductor structure, depositing a dielectric material over the semiconductor structure; treating the dielectric material with a gaseous species carried in a supercritical fluid, and after the treating, reducing a thickness of the dielectric material.

In some embodiments, the dielectric material includes silicon and oxygen. In some embodiments, the gaseous species includes hydrogen or oxygen. In some implementations, the supercritical fluid includes supercritical carbon dioxide. In some embodiments, the supercritical fluid includes a temperature between than 100° C. and about 200° C. In some instances, the supercritical fluid includes a pressure between about 100 atmosphere (atm) and about 200 atm. In some embodiments, the reducing of the thickness of the dielectric material includes etching or planarization. In some embodiments, the planarization includes chemical mechanical polishing (CMP).

In another exemplary aspect, the present disclosure is directed to a radical treatment system. The radical treatment system includes a gas source, a carrier fluid source, a heat exchanger configured to cool or heat up a carrier fluid from the carrier fluid source to a temperature greater than a supercritical temperature of the carrier fluid, a pump configured to pump the carrier fluid from the heat exchanger to a pressure greater than a supercritical pressure of the carrier fluid to form supercritical fluid, a autoclave to receive a gas from the gas source and the supercritical fluid from the heat exchanger to form a gas radical, and a process chamber controllably connected to the autoclave to receive the gas radical carried by the supercritical fluid. The process chamber is configured to receive a substrate and a dielectric material disposed over the substrate.

In some embodiments, the gas source is an oxygen source or a hydrogen source. In some implementations, the carrier fluid source is a carbon dioxide source. In some embodiments, the supercritical temperature is about 31° C. In some embodiments, the supercritical pressure is about 72.8 atmosphere (atm). In some implementations, the dielectric material includes silicon and oxygen. In some instances, the substrate is heated to a temperature between about 100° C. and about 200° C. In some embodiments, the process chamber is maintained at a process pressure between about 100 atm and about 200 atm.

In yet another exemplary aspect, the present disclosure is directed to a method. The method includes receiving a workpiece that includes at least one of a plurality of metal layers in a gate structure, depositing a dielectric material over the workpiece, treating the dielectric material with a gaseous species carried in a supercritical fluid, and after the treating, reducing a thickness of the dielectric material.

In some embodiments, the dielectric material includes silicon, carbon, hydrogen, and oxygen. In some implementations, the gaseous species includes hydrogen or oxygen and the supercritical fluid includes supercritical carbon dioxide. In some embodiments, the supercritical fluid includes a temperature greater than 31° C. and the supercritical fluid includes a pressure greater than 72.8 atmosphere (atm).

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a semiconductor structure, the semiconductor structure comprising a dielectric layer, at least one hard mask layer over the dielectric layer, and an opening extending through the at least one hard mask layer and the dielectric layer;
depositing a dielectric material over the opening;
after the depositing, treating the dielectric material with a gaseous species carried in a supercritical fluid; and
after the treating, reducing a thickness of the dielectric material,
wherein the reducing of the thickness of the dielectric material comprises removing the at least one hard mask layer and a portion of the dielectric layer.

2. The method of claim 1,
wherein the dielectric material comprises silicon and oxygen.

3. The method of claim 1, wherein the gaseous species comprises hydrogen gas ($H_2$) or oxygen gas ($O_2$).

4. The method of claim 1, wherein the supercritical fluid comprises supercritical carbon dioxide.

5. The method of claim 4, wherein the supercritical fluid comprises a temperature between than 100° C. and about 200° C.

6. The method of claim 4, wherein the supercritical fluid comprises a pressure between about 100 atmosphere (atm) and about 200 atm.

7. The method of claim 1, wherein the reducing of the thickness of the dielectric material comprises etching or planarization.

8. The method of claim 7, wherein the planarization comprises chemical mechanical polishing (CMP).

9. A method, comprising:
receiving a workpiece that comprises:
at least one channel structure in a gate trench, and
a work function layer wrapping around the at least one channel structure;
depositing a dielectric material over the gate trench, the at least one channel structure and the work function layer;
treating the dielectric material with a gaseous species carried in a supercritical fluid; and after the treating, reducing a thickness of the dielectric material such that a top surface of the dielectric material is lower than a topmost surface of the at least one channel structure.

10. The method of claim 9, wherein the dielectric material comprises silicon, carbon, hydrogen, and oxygen.

11. The method of claim 9,
wherein the gaseous species comprises hydrogen gas ($H_2$) or oxygen gas ($O_2$),
wherein the supercritical fluid comprises supercritical carbon dioxide.

12. The method of claim 9,
wherein the supercritical fluid comprises a temperature greater than 31° C.,
wherein the supercritical fluid comprises a pressure greater than 72.8 atmosphere (atm).

13. A method, comprising:
providing a semiconductor structure comprising:
first bottom channel members,
first top channel members over the first bottom channel members,
second bottom channel members,
second top channel members over the second bottom channel members,
a first bottom gate structure wrapping around the first bottom channel members,
a first top gate structure wrapping around the first top channel members,
a second bottom gate structure wrapping around the second bottom channel members,
a second top gate structure wrapping around the second top channel members, and
an opening extending from between the first bottom gate structure and the second bottom gate structure to between the first top gate structure and the second top gate structure;
depositing a dielectric material over the first top gate structure, the second top gate structure, and the opening;
performing a low-thermal-budget dielectric densification treatment to the dielectric material; and
after the performing, reducing a thickness of the dielectric material,
wherein an aspect ratio of the opening is between about 4 and about 12,
wherein the low-thermal-budget dielectric densification treatment comprises use of a supercritical fluid.

14. The method of claim 13, wherein the low-thermal-budget dielectric densification treatment further comprises use of hydrogen gas ($H_2$) and oxygen gas ($O_2$).

15. The method of claim 13, wherein the dielectric material comprises silicon, carbon, hydrogen, and oxygen.

16. The method of claim 13, wherein the supercritical fluid comprises supercritical carbon dioxide.

17. The method of claim 13, wherein the supercritical fluid comprises a temperature between than 100° C. and about 200° C.

18. The method of claim 13, wherein the supercritical fluid comprises a pressure between about 100 atmosphere (atm) and about 200 atm.

19. The method of claim 13, wherein the reducing of the thickness of the dielectric material comprises etching or planarization.

20. The method of claim 13,
wherein the first bottom gate structure is a p-type gate structure, wherein the first top gate structure is an n-type gate structure.

* * * * *